United States Patent
Shaeffer et al.

(10) Patent No.: US 9,703,503 B2
(45) Date of Patent: *Jul. 11, 2017

(54) RECONFIGURABLE MEMORY SYSTEM DATA STROBES

(71) Applicant: RAMBUS INC., Sunnyvale, CA (US)

(72) Inventors: Ian Shaeffer, Los Gatos, CA (US); Frederick Ware, Los Altos Hills, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/509,572

(22) Filed: Oct. 8, 2014

(65) Prior Publication Data

US 2015/0023118 A1    Jan. 22, 2015

Related U.S. Application Data

(63) Continuation of application No. 12/678,739, filed as application No. PCT/US2008/074247 on Aug. 25, 2008, now Pat. No. 8,868,873.

(Continued)

(51) Int. Cl.
    *G06F 3/06*     (2006.01)
    *G06F 13/16*     (2006.01)
    *G11C 7/22*     (2006.01)

(52) U.S. Cl.
    CPC .......... *G06F 3/0634* (2013.01); *G06F 3/0665* (2013.01); *G06F 3/0689* (2013.01);
(Continued)

(58) Field of Classification Search
    CPC G11C 11/4093; G11C 7/1078; G06F 13/1678
    See application file for complete search history.

(56) References Cited

U.S. PATENT DOCUMENTS

| 5,343,438 A | 8/1994 | Choi et al. |
| 6,286,077 B1 | 9/2001 | Choi et al. |

(Continued)

OTHER PUBLICATIONS

Chang, Jaci, "Design Considerations for the DDR3 Memory Subsystem," 2005 JEDEC Presentation. 20 pages.

(Continued)

*Primary Examiner* — Gary W Cygiel
(74) *Attorney, Agent, or Firm* — Lowenstein Sandler LLP

(57) ABSTRACT

In a reconfigurable data strobe-based memory system, data strobes may be re-tasked in different modes of operation. For example, in one mode of operation a differential data strobe may be used as a timing reference for a given set of data signals. In a second mode of operation, one of the components of the differential data strobe may be used as a timing reference for a first portion of the set of data signals and the other component used as a timing reference for a second portion of the set of data signals. Different data mask-related schemes also may be invoked for different modes of operation. For example, in a first mode of operation a memory controller may generate a data mask signal to prevent a portion of a set of data from being written to a memory array. Then, in a second mode of operation the memory controller may invoke a coded value replacement scheme or a data strobe transition inhibition scheme to prevent a portion of a set of data from being written to a memory array.

20 Claims, 20 Drawing Sheets

Related U.S. Application Data

(60) Provisional application No. 60/975,762, filed on Sep. 27, 2007.

(52) U.S. Cl.
CPC ............ *G06F 13/1694* (2013.01); *G11C 7/22* (2013.01); *G06F 2212/262* (2013.01)

(56) References Cited

U.S. PATENT DOCUMENTS

| | | | |
|---|---|---|---|
| 6,449,198 B1 * | 9/2002 | Hamade | G11C 7/1048 365/189.14 |
| 6,826,663 B2 | 11/2004 | Perego et al. | |
| 6,839,393 B1 | 1/2005 | Sidiropoulos | |
| 6,889,304 B2 | 5/2005 | Perego et al. | |
| 6,909,643 B2 | 6/2005 | Kwean | |
| 7,127,584 B1 | 10/2006 | Thompson et al. | |
| 7,548,601 B2 | 6/2009 | Sidiropoulos | |
| 2004/0221106 A1 | 11/2004 | Perego et al. | |
| 2005/0071707 A1 | 3/2005 | Hampel | |
| 2007/0070669 A1 | 3/2007 | Tsern | |
| 2007/0147016 A1 | 6/2007 | Osborne | |
| 2007/0291557 A1 * | 12/2007 | Nishio | G11C 5/02 365/193 |
| 2008/0256282 A1 | 10/2008 | Guo et al. | |

OTHER PUBLICATIONS

International Preliminary Report on Patentability (Chapter I) dated Apr. 8, 2010 in International Application No. PCT/US2008/074247. 6 pages.

Micron Technology, Inc., "1 GB DDR3 SDRAM Data Sheet," 2006, pp. 1-15. 15 pages.

Micron Technology, Inc., "DDR2 Differential DQS Feature Technical Note," 2003, pp. 1-2. 2 pages.

Samsung Electronics, "DDR3 SDRAM Specification," Rev. 0.0, Jan. 2007, DDR3 SDRAM Device Operation. 66 pages.

Samsung Electronics, "DDR3 SDRAM Specification," Rev. 0.1, Jan. 2007, Unbuffered DIMM. 59 pages.

Shen, Dr. William Wu, "System Challenges on DDR3 High Speed Clock/Address/Command Fly-by Bus Topology," Infineon Technologies, JEDEX San Jose, Apr. 18, 2006. 47 pages.

Shen, William Wu, "DDR3 Functional Outlook," 2005 JEDEC Presentation. 31 pages.

Weidlich, Rainer, "What Comes Next in Commodity DRAMS—DDR3," Infineon Technologies, Jun. 2005. 4 pages.

* cited by examiner

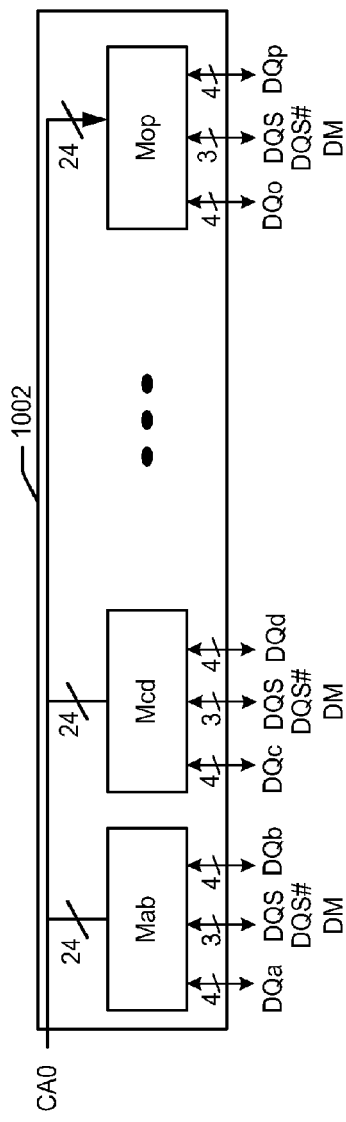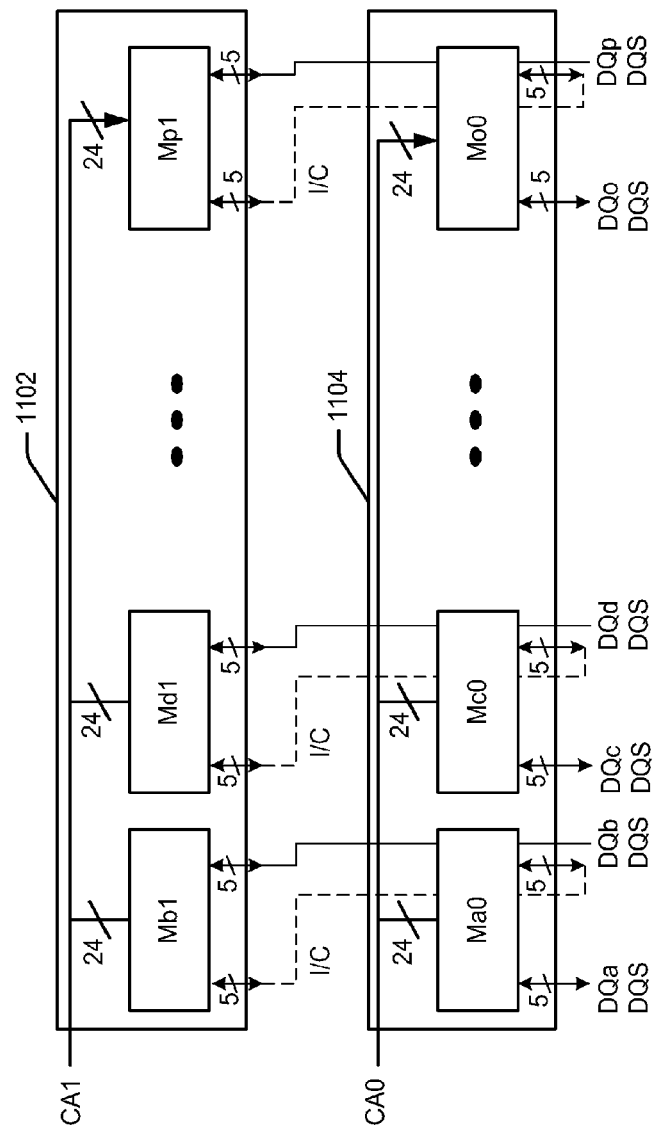
FIG. 10A
FIG. 11A

RECONFIGURABLE MEMORY SYSTEM DATA STROBES

RELATED APPLICATION

This application is a continuation of U.S. patent application Ser. No. 12/678,739, filed Jun. 30, 2010, which is a 371 of PCT International Application number PCT/US2008/074247, filed Aug. 25, 2008, which claims the benefit of U.S. Provisional Application No. 60/975,762, filed Sep. 27, 2007, which are hereby incorporated by reference in its entirety.

TECHNICAL FIELD

This application relates to computer memory technology

BACKGROUND

In a reconfigurable memory system the amount or type of memory storage in the memory system may be changed to some extent to accommodate a change in the memory requirements of an associated system (e.g., a computing system). For example, a memory system may include several connectors (e.g., sockets) that are configured to receive memory modules. The memory storage of the memory system may thus be changed by removing and/or adding the desired number and type of memory modules, where different types of memory modules may include a different quantity or different types of memory devices (e.g., DRAM integrated circuits).

A memory system may employ a memory controller through which a component (e.g., system processor) of an associated system gains access to the memory. In general, a memory controller is coupled to the connectors via a memory bus and is adapted to control the operation of and provide access to the memory modules.

In some implementations a memory bus is routed in a daisy-chain fashion between the memory controller and the memory modules. For example, printed circuit board traces for the memory bus may be routed from the memory controller to a first one of the memory module connectors and then to a second one of the memory module connectors and so on. In practice, such a configuration may negatively impact high speed signals that are sent over the memory bus. For example, electrical discontinuities may be present at any connector that is not populated by a memory module. In addition, the memory bus may have different impedance characteristics depending on the number and placement of the memory modules on the memory bus. Factors such as these may cause signal degradation that limits the maximum operating speed of the memory system.

BRIEF DESCRIPTION OF THE DRAWINGS

Sample features, aspects and advantages of the disclosure will be described in the detailed description and appended claims that follow, and in the accompanying drawings, wherein:

FIG. 8, including

FIG. 9, including

FIG. 10, including FIGS. 10A and 10B, are simplified diagrams relating to the use of a data mask signal;

FIG. 11, including FIGS. 11A and 11B, are simplified diagrams relating to the use of a data mask scheme where transitions of a data strobe signal are disabled;

FIG. 12, including

FIG. 13, including

Figure 1:
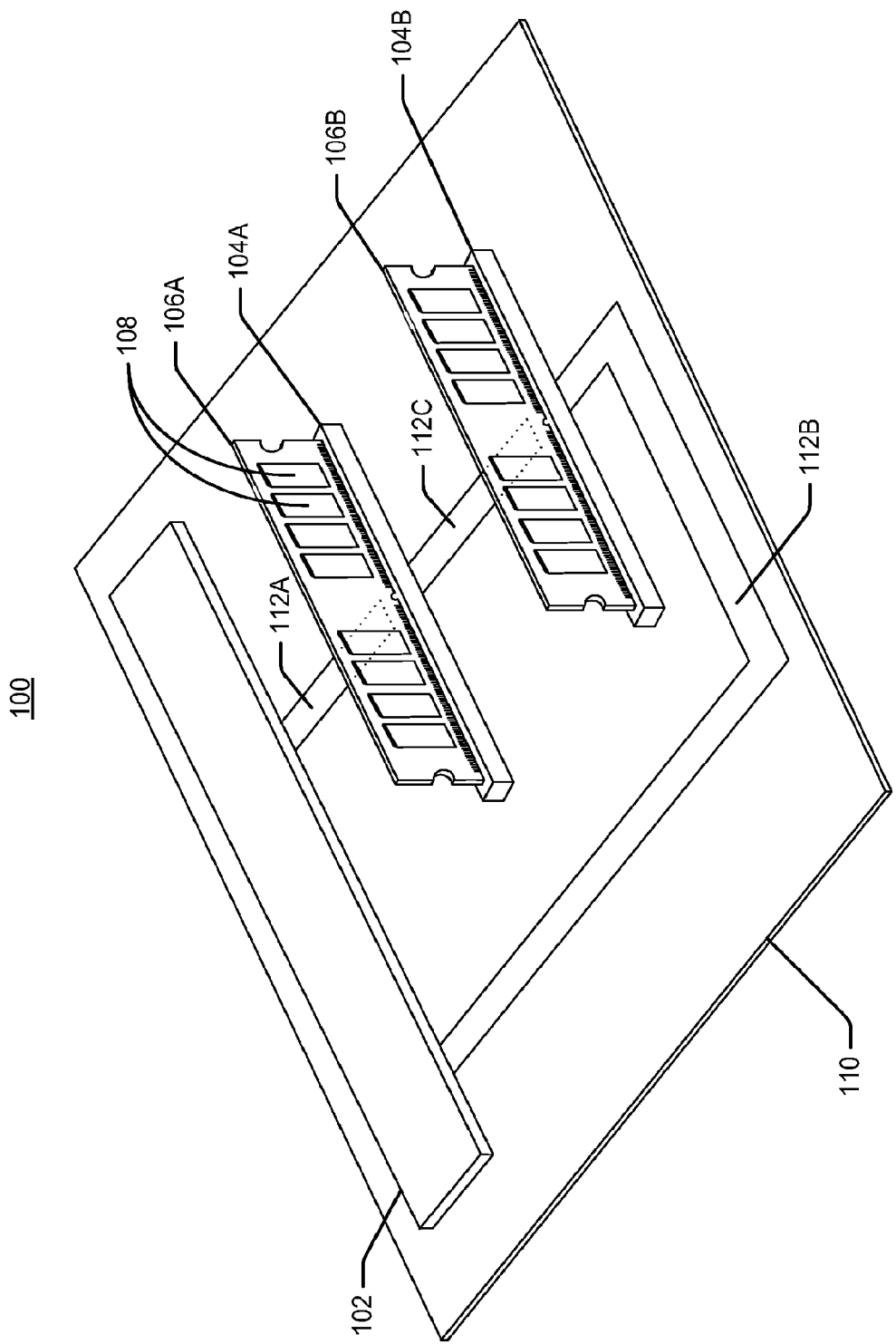
FIG. 1 is a simplified diagram of an embodiment of a memory system.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals may be used to denote like features throughout the specification and figures.

DETAILED DESCRIPTION

The description that follows sets forth one or more illustrative embodiments. It should be appreciated that the teachings herein may be embodied in a wide variety of forms, some of which may appear to be quite different from those of the disclosed embodiments. Consequently, the specific structural and functional details disclosed herein are merely representative. For example, based on the teachings herein one skilled in the art should appreciate that a given structural or functional detail may be incorporated in an embodiment independently of any other structural or functional details. Thus, an apparatus may be implemented or a method practiced using any number of the structural or functional details set forth in any disclosed embodiment(s). Also, an apparatus may be implemented or a method practiced using other structural or functional details in addition to or other than the structural or functional details set forth in any disclosed embodiment(s).

The disclosure relates in some aspects to reconfigurable memory systems as well as associated memory components and methods. In general, reconfiguration of a memory system may involve a change in the type and/or the amount of memory in the system. For example, a reconfigurable memory system may at one point in time include one memory module and at another point in time also include another memory module.

In accordance with some aspects of the disclosure, a first mode of operation is invoked when a single memory module is installed in the memory system and a second mode of operation is invoked when more than one memory module is installed in the memory system. In the first mode of operation the entire set of signal leads for a memory data bus (hereafter, "data bus") is routed to the single memory module while in the second mode of operation the signals leads for the data bus are split among the memory modules. As a specific example, in a configuration where two memory modules are installed in the memory system half of the data bus may be routed to one of the memory modules and the other half of the data bus may be routed to the other memory module. By splitting the data bus in this manner loading on the data bus may be reduced to some extent. Moreover, as discussed in more detail below, splitting of the data bus may be employed in some embodiments to provide point-to-point connectivity between a memory controller and one or more memory modules, regardless of the number of memory modules installed in the memory system.

In conjunction with the splitting of the data bus in the second mode of operation, various provisions may be taken to provide data strobe signals and data mask-related information for each of the resulting portions of the data bus. For example, in some embodiments a differential data strobe that is used as a timing reference for the data bus in the first mode of operation may be split along with the data bus in the second mode of operation. That is, one component (e.g., rail) of the differential data strobe may be provided for one of the memory modules as a timing reference for a first portion of the data bus and the other component (e.g., rail) of the differential data strobe may be provided for the other memory module as a timing reference for a second portion of the data bus. In addition, in some embodiments a data mask signal is used in the first mode of operation to identify portions of a write burst that are not to be written to the system memory, while portions of a write burst that are not to be written are identified in the second mode of operation by replacing those portions with a code value. Also, in some embodiments a data mask signal is used in the first mode of operation as above, while in the second mode of operation a transition of a data strobe signal is disabled to prevent a portion of a write burst from being written to system memory.

These and other aspects of the disclosure will be discussed in more detail in the context of a data strobe-based memory system that provides reconfigurable point-to-point data bus connectivity between a memory controller and one or more memory modules. It should be appreciated that the discussion that follows is provided for illustration purposes and that disclosed concepts may be applicable to other types of memory systems, including those that do not provide point-to-point connectivity or that employ other types of memory or memory control components.

FIG. 1 illustrates an embodiment of a memory system 100 including a memory controller 102 and connectors 104A and 104B that are adapted to receive memory modules 106A and 106B, respectively. In accordance with conventional practice, each memory module 106A and 106B may include one or more memory devices 108 (e.g., a DRAM integrated circuit) that collectively comprise a memory array for the memory module and may include one or more other components as discussed below. For convenience, the memory device or memory devices 108 may simply be referred to as the memory device 108 in the discussion that follows. Also for convenience, the following disclosure may refer to a memory module performing some function, information being provided to a memory module, or information being obtained from a memory module. Here, it should be understood that these operations may in fact relate to a component (e.g., a memory device or a memory buffer) of the memory module.

The memory system 100 may be reconfigured by adding or removing the memory modules 106A and 106B. For example, in a first mode of operation either the memory module 106A or the memory module 106B is installed in the memory system 100. In a second mode of operation both memory modules 106A and 106B are installed in the memory system 100.

The memory system 100 includes various signal paths to provide an address and control bus and a data bus between the memory controller 102 and the memory module 106A and 106B. To reduce the complexity of FIG. 1, the figure does not depict signal traces associated with the address and control bus. In a typical implementation the signal paths for the address and data buses comprise traces of a printed circuit board 110 upon which the memory controller 102 and the connectors 104A and 104B are mounted. It should be appreciated, however, that other embodiments may employ other means for providing these signal paths.

The paths 112A-112C of FIG. 1 illustrate in a simplified manner an example of how a memory data bus may be routed between the memory controller 102 and the connectors 104A and 104B to provide point-to-point connectivity between the memory controller 102 and either one or both of the memory modules 106A and 106B.

As represented by the path 112A, a first portion of the data bus runs between the memory controller 102 and the connector 104A. This portion of the data bus is not, in and of itself, routed to the connector 104B. Thus, when the memory module 106A is inserted into the connector 104A, the first portion of the data bus is routed in a point-to-point manner between the memory controller 102 and the memory module 106A.

As represented by the path 112B, a second portion of the data bus runs between the memory controller 102 and the connector 104B. This portion of the data bus is not, in and of itself, routed to the connector 104A. When the memory module 106B is inserted into the connector 104B, the second portion of the data bus is routed in a point-to-point manner between the memory controller 102 and the memory module 106B.

As represented by the path 112C, an interconnect portion of the data bus (e.g., a set of signal leads such as printed circuit board traces) runs between the connector 104A and the connector 104B. The data bus interconnect 112C is used in conjunction with a continuity module (not shown in FIG. 1) that is inserted into an otherwise unused one of the connectors 104A or 104B to couple either the first or second portion of the data bus to the other one of the connectors 104A or 104B. In this way, the entirety of the data bus may be routed to the first memory module 106A or to the second memory module 106B.

For example, when the memory module 106A is the only memory module to be installed in the memory system 100, a continuity module is inserted in the otherwise unoccupied connector 104B. In this case the continuity module couples the second data bus portion 112B to the data bus interconnect 112C, thereby enabling the data bus interconnect 112C to couple the second data bus portion 112B to the connector 104A. Thus, in this configuration the second portion of the data bus is routed in a point-to-point manner between the memory controller 102 and the memory module 106A.

In contrast, when the memory module 106B is the only memory module to be installed in the memory system 100, a continuity module is inserted in the otherwise unoccupied connector 104A. In this case the continuity module couples the first data bus portion 112A to the data bus interconnect 112C, thereby enabling the data bus interconnect 112C to couple the first data bus portion 112A to the connector 104B. Consequently, in this configuration the first portion of the data bus is routed in a point-to-point manner between the memory controller 102 and the memory module 106B.

From the above it should be appreciated that the use of the connectors 104A and 104B, the data bus portions 112A-112C, and an optional continuity module enables the data bus to be routed in a point-to-point manner between the memory controller 102 and either the memory module 106A or the memory module 106B, regardless of the configuration of the memory system 100. That is, in a first mode of operation where only a single memory module is used in the memory system 100, the entirety of the data bus is coupled to the single memory module in a point-to-point manner. Conversely, in a second mode of operation when both of the memory modules 106A and 106B are used in the memory system 100, the first portion of the data bus is routed in a point-to-point manner to the memory module 106A and the second portion of the data bus is routed in a point-to-point manner to the memory module 106B. In this second mode of operation, neither the first data bus portion 112A nor second data bus portion 112B is coupled to the data bus interconnect 112C.

Through the use of such point-to-point connectivity a memory bus may have fewer or no discontinuities and more predictable impedance characteristics, irrespective of the current configuration. Consequently, such a memory system may operate at higher frequencies than other upgradeable memory systems.

Figure 2:
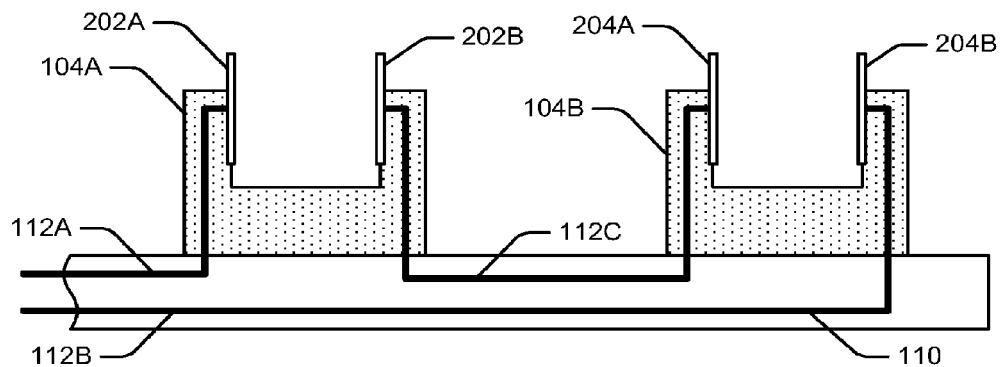
FIG. 2 is a simplified diagram illustrating bus connections to memory module connectors for an embodiment of a memory system.
Figure 3:
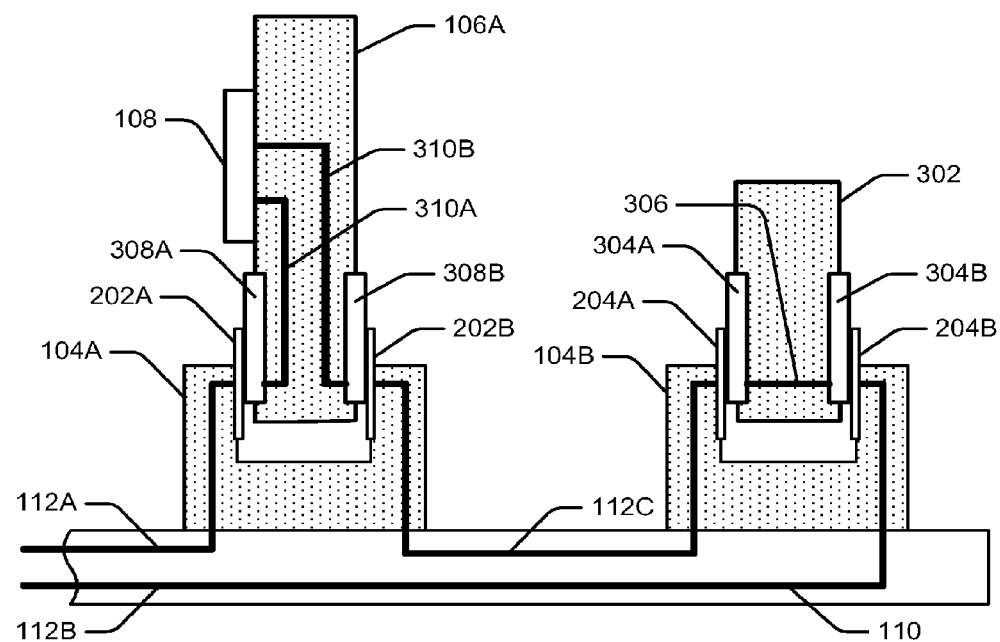
FIG. 3 is a simplified diagram of an embodiment of a memory system in a first configuration including a memory module and a continuity module.
Figure 4:
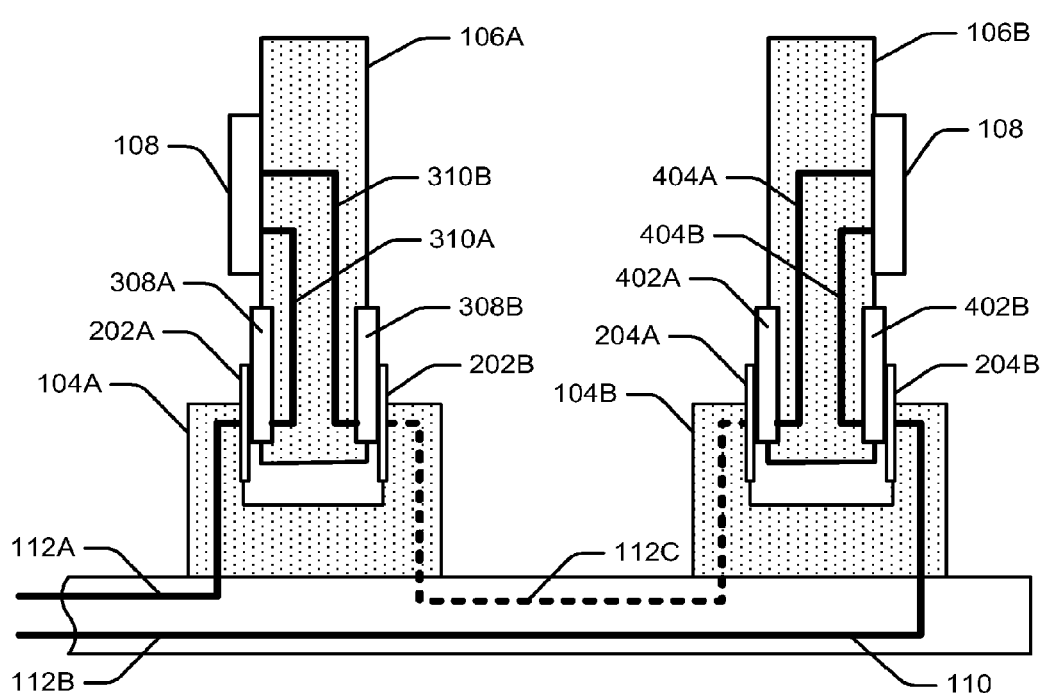
FIG. 4 is a simplified diagram of an embodiment of a memory system in a second configuration including two memory modules.

Various aspects relating to an example of how the memory system 100 may be reconfigured and how different portions of the data bus are routed to provide point-to-point connectivity in different modes of operation will now be discussed in conjunction with FIGS. 2-4. FIG. 2 illustrates how the different portions of the data bus 112 may be routed to the connectors 104. FIG. 3 illustrates a first mode of operation where a single memory module 106A is installed in the memory system 100. FIG. 4 illustrates a second mode of operation where two memory modules 106A and 106B are installed in the memory system 100.

To reduce the complexity of these figures, bus portions are represented by single lines and sets of contacts are represented by a single contact. It should be appreciated, however, that a typical system will include many signal paths for the data bus each of which may connect to a unique contact. For example, in a system that utilizes a 64-bit data bus, each of the bus portions may include 32 signal paths for the data and additional signal paths for associated signals such as data strobes and data masks. For convenience, the terms bits, signals, signal paths, and signal leads may be used herein to refer to the parallel signals that comprise a bus (e.g., a data bus) and to any physical structure that may be used to carry these signals.

To further reduce the complexity of the figures, other data paths for address, control, and clock signals are not shown. It should be appreciated, however, that these signals are routed between the memory controller 102 and each memory module 106A and 106B in a suitable manner.

FIG. 2 illustrates a simplified partial side view of the connectors 104A and 104B, the printed circuit board 110, and the bus portions 112A-112C of FIG. 1. The first data bus portion 112A is routed from the memory controller (not shown in FIG. 2) in a point-to-point manner through the printed circuit board 110 to the connector 104A. The second data bus portion 112B is routed from the memory controller in a point-to-point manner through the printed circuit board 110 to the connector 104B. An interconnect bus portion 112C couples the connector 104A with the connector 104B.

In some embodiments the bus portions 112A-112C comprise sets of signal leads that are provided in (i.e., entirely or partially within) the printed circuit board 110. It should be appreciated, however, that the buses 112A-112C or any other buses described herein may be implemented in some other suitable manner.

The connectors 104A and 104B includes rows of contacts 202A-B and 204A-B, respectively, that are configured to make contact with corresponding contacts of a memory module or a continuity module that is inserted into the connector (not shown in FIG. 2). Here, the data bus portion 112A is coupled to a portion of the contacts 202A of the connector 104A. In a similar manner the data bus portion 112B is coupled to a portion of the contacts 204A of the connector 104B. The data bus interconnect 112C is coupled between a portion of the contacts 202B of the connector 104A and a similar portion of the contacts 204B of the connector 104B.

FIG. 3 illustrates an example of the first mode of operation where the memory module 106A is inserted into the connector 104A and a continuity module 302 is inserted into the connector 104B. In this case, the continuity module 302 couples the second portion of the data bus 112B to the data bus interconnect 112C so that the second portion of the data bus 112B is coupled to the memory module 106A.

To this end, the continuity module 302 includes sets of contacts 304A and 304B along with associated signal paths 306. The set of contacts 304A is configured to contact the contacts 204A of the connector 104B. Similarly, the set of contacts 304B is configured to contact the contacts 204B. In addition, the signal paths 306 are configured to individually connect the contacts 304A to the contacts 304B.

In a typical implementation the continuity module 302 includes passive connections (e.g., traces on a printed circuit board). It should be appreciated, however, that other techniques may be employed to couple the bus portions 112B and 112C.

The memory module 106A also includes contacts 308A and 308B (e.g., a connector interface) and associated signal paths 310A and 310B to couple the bus portions 112A and 112B to the memory device 108. The set of contacts 308A is configured to contact the contacts 202A of the connector 104A. Similarly, the set of contacts 308B is configured to contact the contacts 202B. The signal paths 310A and 310B thereby respectively couple the first and second data bus portions 112A and 112B to the memory device 108.

Thus, the signal paths for the data bus portions 112A and 112B only terminate on the memory module 106A (e.g., at the memory device 108). Consequently, point-to-point connectivity is provided for the entire data bus between the memory controller 102 (not shown in FIG. 3) and the memory module 106A.

As will be discussed in more detail below, in some implementations the memory module 106A includes one or more memory buffers or other suitable component(s) for facilitating writing data to and reading data from the memory device 108. Such a component may be coupled between the data bus contacts 308A and 308B of the memory module 106A and a data path for the memory device 108.

FIG. 4 illustrates an example of the second mode of operation where the memory module 106A is inserted into the connector 104A and in the memory module 106B is inserted into the connector 104B. The memory module 106B may be identical to the memory module 106A. Thus, contacts 402A and 402B of the memory module 106B that are adapted to contact the contacts 204A and 204B of the connector 104B may be identical or similar to the contacts 308A and 308B of the memory module 106A. Also, signal paths 404A and 404B of the memory module 106B may be identical or similar to the signal paths 310A and 310B of the memory module 106A.

The configuration of FIG. 4 provides point-to-point connectivity for the entire data bus between the memory controller 102 (not shown in FIG. 4) and each of the memory modules 106A and 106B. As represented by the dashed line for the data bus interconnect 112C, the second data bus portion 112B is not coupled to the first memory module 106A in the second mode of operation. Thus, the signal paths for the data bus portion 112A (e.g., bits 0-31 and associated signals) only terminate on the memory module 106A (e.g., at the memory device 108). Similarly, the signal paths for the data bus portion 112B (e.g., bits 32-63 and associated signals) only terminate on the memory module 106B (e.g., at the memory device).

To support this configuration of the data bus, each memory module 106A and 106B is adapted to reconfigure how data is written to and read from its respective memory device 108. For example, a multiplexer or some other suitable component of the memory module 106A (e.g., on the memory module 106A or in each memory device 108 of the memory module 106A) may route data between one half of the data signals (e.g., the signal path 310A) and the entire memory array (device 108) of the memory module 106A. The memory module 106B also may include this multiplexer-type functionality to provide similar connectivity for one half of its inputs (e.g., the signal path 404A).

In conjunction with this reconfiguration of the data path for the memory modules 106A and 106B, a corresponding reconfiguration of the addressing scheme for each memory module may be made to provide access to the entire memory array. For example, in a reconfiguration where the data path for the memory system 100 is split between two modules, the corresponding address space of each memory module (i.e., the memory space for the memory devices of the memory module) may be doubled. This may be accomplished in some embodiments by utilizing an additional address bit or some other signal.

Some memory architectures may subdivide the data bus and provide separate timing references for each portion (e.g., four bits, eight bits, etc.) of the data bus. Such a scheme may be desirable to avoid timing skew problems that may otherwise be associated with routing a large number of leads in parallel (e.g., due to different signal path lengths of the different leads). In a synchronous memory architecture such timing references may take the form of data strobes. For example, in a DDR memory system, data may be written into or read out of a memory module on the rising and falling edges of the data strobe. In some cases (e.g., DDR-SDRAM) the data strobes may be single-ended. Thus a single data strobe lead may be associated with a given portion of the data bus. In some cases (e.g., DDR3), a data strobe may be implemented as a differential signal. Here, when operating at higher data rates, the use of a differential signal may improve the quality of the data strobe signal. As mentioned above, in conjunction with the subdividing of the data bus, signals associated with each portion of the data bus may be subdivided as well in accordance with the teachings herein.

Figure 5:
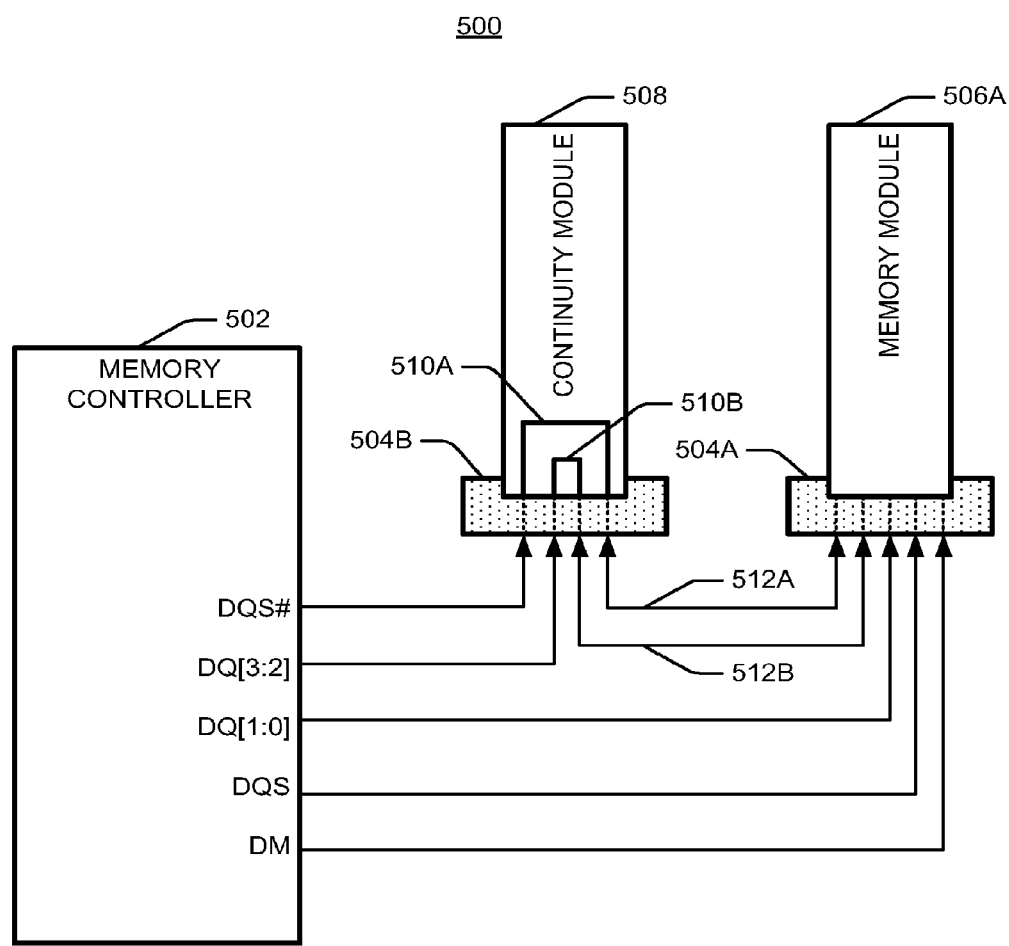
FIG. 5 is a simplified diagram of an embodiment of a memory system in a first configuration illustrating a subset of a data bus and an associated differential data strobe.
Figure 6:
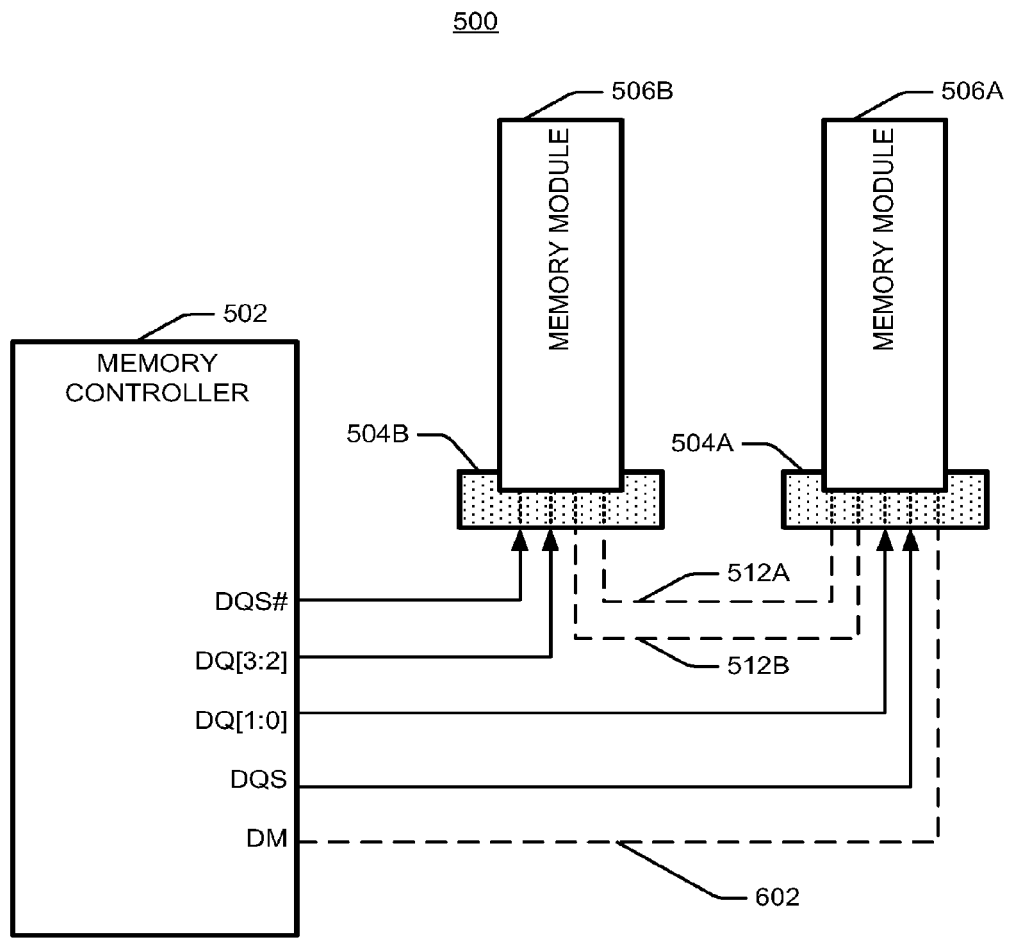
FIG. 6 is a simplified diagram of an embodiment of a memory system in a second configuration illustrating how a data bus and an associated differential data strobe may be split so that each subset of the signals is routed to a different memory module.

As a specific example, FIGS. 5 and 6 depict a reconfigurable memory system 500 employing a data bus architecture where every set of four bits (e.g., bits 0-3) of a data bus is associated with a differential data strobe signal. For convenience, FIGS. 5 and 6 only depict a single subset of the data bus including four signal lines DQ[3:0], a differential data strobe DQS/DQS#, and a data mask DM. It should be appreciated that routing similar to that shown in FIGS. 5 and 6 may be employed to couple additional subsets of the data bus between a memory controller 502 and one or more memory module connectors 504A and 504B. In other words, the connectors 504A and 504B and a continuity module 508 will also provide signal paths for several other subsets of the data bus (not shown). It also should be appreciated that other embodiments may employ different data bus architectures that use a different number of signals, are subdivided in other ways, or employ other types of signals.

The memory system 500 is reconfigurable and supports two different modes of operation through the use of the connectors 504A and 504B. Also, in a similar manner as discussed above, the memory system 500 provides point-to-point connectivity in both modes of operation by routing different portions of the data bus to different connectors 504A and 504B, and through the use of the continuity module 508. Thus, in the first mode of operation as shown in FIG. 5 a memory module 506A is installed in the connector 504A and the continuity module 508 is installed in the connector 504B. Conversely, in the second mode of operation as shown in FIG. 6 the continuity module 508 is replaced with a memory module 506B.

Referring to FIG. 5, in the first mode of operation each subset of the data bus and an associated differential data strobe signal are routed from the memory controller 502 to the memory module 506A. For example, two data bus signals DQ[1:0] and a first component of the differential strobe signal DQS are routed to the connector 504A and two data bus signals DQ[3:2] and the second component (complement) of the differential strobe signal DQS# are routed to the connector 504B. The continuity module 508 includes signal paths 510A and 510B that couple the DQS# signal and the DQ[3:2] signals to respective paths 512A and 512B of an interconnect bus (collectively "bus 512"). In a similar manner as discussed above, the interconnect bus 512 is coupled to the connector 504A whereby the signals DQ[3:2] and DQS# are provided to the memory module 506A in the first mode of operation.

One or both of the components of the differential data strobe signal DQS/DQS# may be used by the memory devices of the memory module 506A in the first mode of operation. In embodiments where both components of the differential data strobe signal are used, an adjustable delay circuit may be employed (e.g., in a buffer or a memory device of the memory module) to account for different propagation delays along the respective signal path for each component. In embodiments where only a single component (e.g., DQS) of the differential data strobe signal is used, the signal paths 510A and 512A associated with the DQS# signal may not be used or may be eliminated.

FIG. 5 also illustrates an embodiment where the data mask signal DM is provided to the buffer and/or memory devices of memory module 506A in the first mode of operation. As will be discussed in more detail below, in other embodiments other schemes may be employed to prevent data from being written to the memory module 506A. In such a case, the data mask signal may or may not be used in the first mode of operation.

Also, in some embodiments multiple data mask signals may be provided for each subset of the data bus. For example, each memory module connector may have a dedicated data mask signal. In a sample implementation, two data mask signals are provided for each subset of the data bus. In this case, in the first mode of operation one or both of the data mask signals may be used to determine whether data carried by that subset of the data bus is to be written to a memory device. In a similar manner as discussed herein, a continuity module and a printed circuit board may include appropriate signal paths to couple one of the data mask signals from one memory module connector to another memory module connector.

In a second mode of operation the data mask signals are split along with the data bus and the data strobes. Consequently, one of the data mask signals may be used to determine whether data carried by a first half of the subset of the data bus is to be written to a memory device, while the other data mask signal is used to determine whether data carried by a second half of the subset of the data bus is to be written to a memory device.

Referring to FIG. 6, in the second mode of operation each subset of the data bus and the associated differential data strobe are each split such that half of the signals are routed to each memory module. For example, two data bus signals DQ[1:0] and the strobe DQS signal are routed to the memory module 506A and two data bus signals DQ[3:2] and the strobe complement DQS# signal are routed to the memory module 506B. In this case, as represented by the dashed lines 512A and 512B, the DQ[3:2] and DQS# signals are not coupled to the memory module 506A.

As will be discussed in more detail below, various provisions may be made to accommodate the different polarities of the differential data strobe signal. For example, in some embodiments a component (e.g., a buffer or a memory device) of one of the memory modules 506A or 506B may invert the single-ended data strobe signal that it receives in the second mode of operation.

Alternatively, in some embodiments the memory controller 502 may invert one of the components of the differential data strobe signal in the second mode of operation. In this case the memory modules 506A and 506B will receive single-ended data strobe signals that have the same polarity with respect to the data on the data bus. Advantageously, in the event a component (e.g., a buffer or memory device) of a memory module is configured to use a single ended data strobe signal in the first mode of operation, such a memory module may not need to be reconfigured to accommodate the splitting of the differential data strobe signal in the second mode of operation.

Provisions also may be made to properly align the signals for each portion of a data bus segment. For example, the skew of signals associated with one portion of the data bus segment may be adjusted independently of the skew of signals associated with the other portion of the data bus segment to accommodate differences in the propagation delay for the respective signal paths in the second mode of operation. Thus, in the example of FIG. 6, one skew adjustment may be made for the DQ[1:0] and DQS signals and another separate skew adjustment made for the DQ[3:2] and DQS# signals (e.g., by the memory controller and/or a component of a memory module).

As represented by the dashed line 602 in FIG. 6, the data mask signal DM may optionally be used by a component (e.g., buffer or memory device) of the memory module 506A in the second mode of operation. In embodiments where a component of the memory module 506A uses the data mask signal here, another scheme may be employed to provide similar functionality for a component the memory module 506B. Alternatively, in some embodiments such a scheme may be used to provide data mask-type functionality for components of both memory modules 506A and 506B in the second mode of operation. Two examples of such schemes will now be described in conjunction with FIGS. 7-13.

Figure 7:
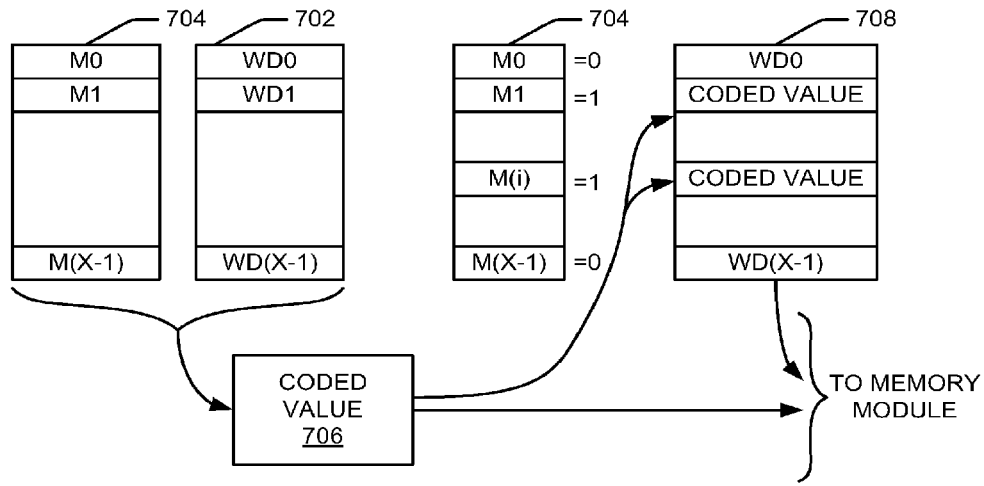
FIG. 7 is a simplified diagram illustrating an example of data flow associated with an embodiment of a data mask keying scheme where write data values are replaced with coded values.
Figure 8A:
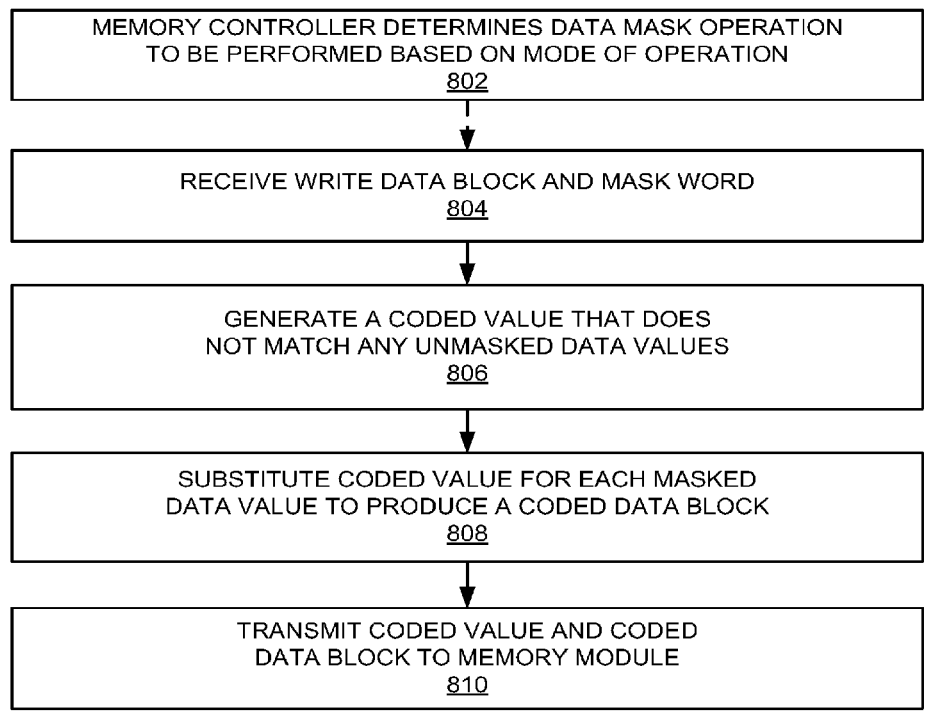
FIGS. 8A and 8B, are flowcharts relating to an embodiment of operations that may be performed in conjunction with a data mask scheme where portions of a set of data are replaced with coded values.
Figure 8B:
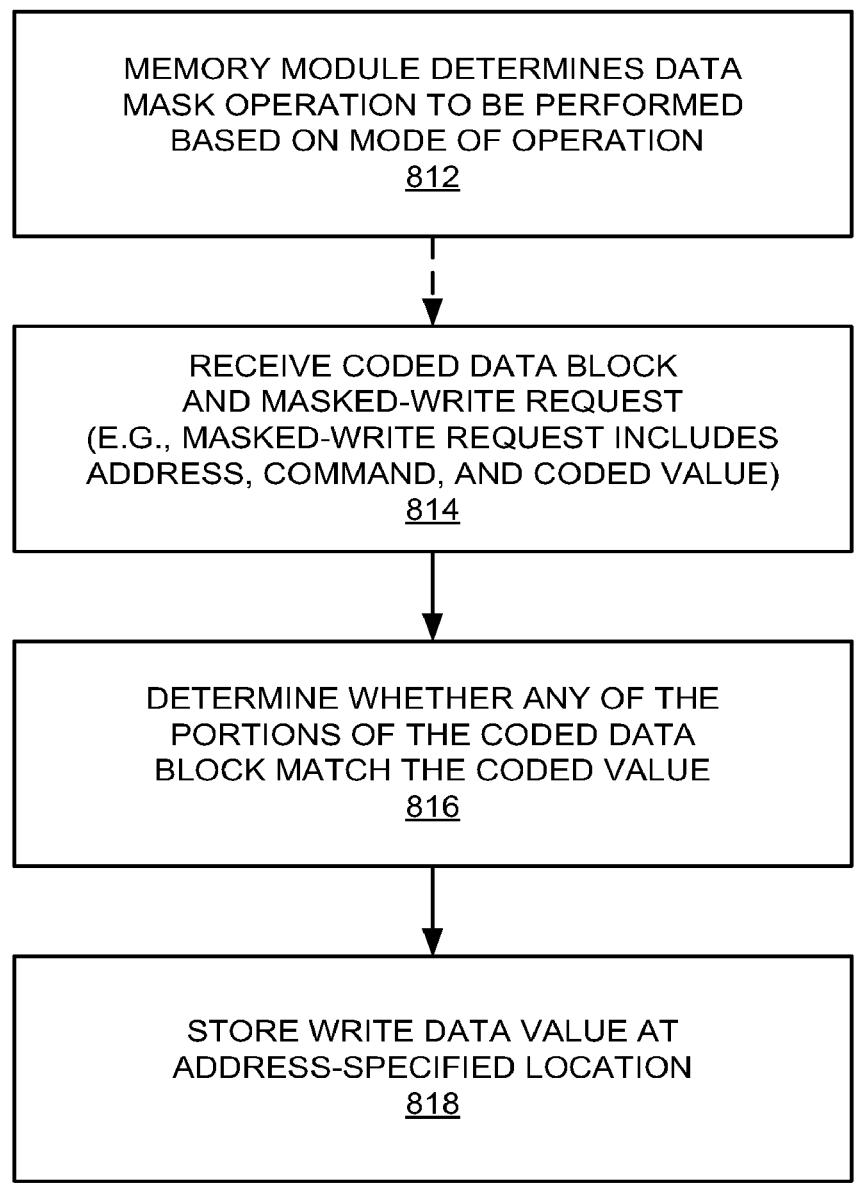
Figure 9A:
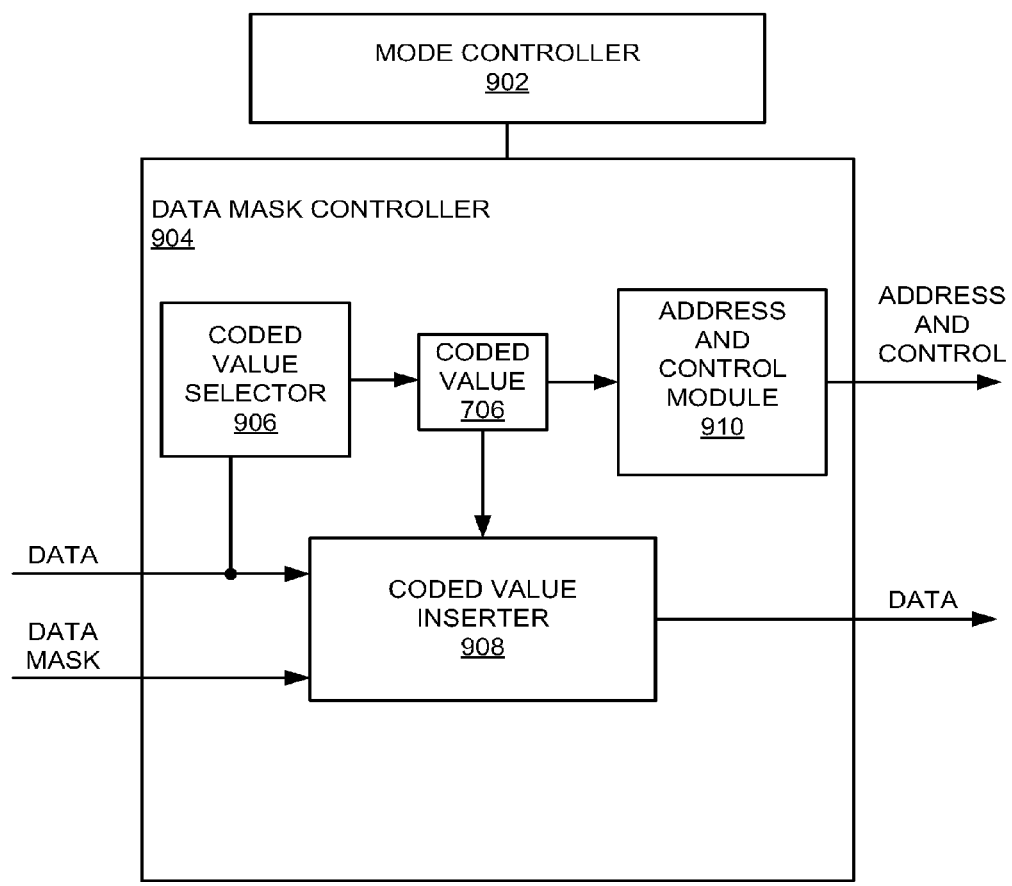
FIGS. 9A and 9B, are simplified block diagrams illustrating sample functional components for implementing a data mask scheme where portions of a set of data are replaced with coded values.
Figure 9B:
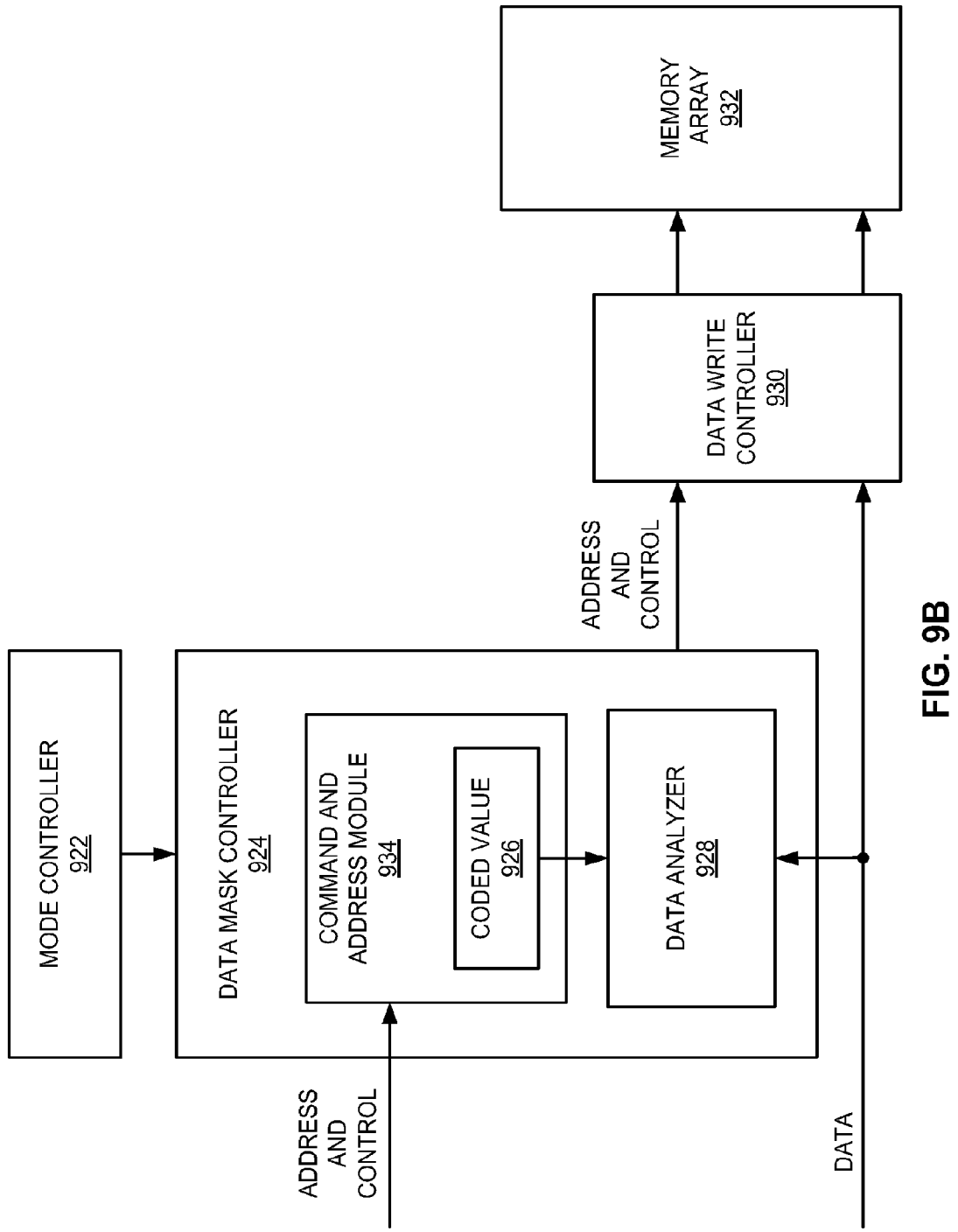

FIGS. 7-9 relate to a scheme where a memory controller replaces "masked data" (any data that is not to be written to a memory array of a memory module) with a coded write data value (hereafter "coded value"). FIG. 7 illustrates an example of data flow when a portion of a set of data is replaced with a coded value. FIG. 8A illustrates representative operations that may be performed by an embodiment of a memory controller. FIG. 8B illustrates representative operations that may be performed by an embodiment of a memory module. FIG. 9A illustrates several representative functional components of an embodiment of a memory controller. FIG. 9B illustrates several representative functional components of an embodiment of a memory module.

For convenience, the operations of FIG. 8 (or any other operations discussed or taught herein) may be described as being performed by specific components. It should be appreciated, however, that these operations may be performed by other types of components and may be performed using a different number of components. It also should be appreciated that one or more of the operations described herein may not be employed in a given implementation.

As represented by block 802 of FIG. 8A and block 812 of FIG. 8B, the memory controller and the memory module may be configured to perform the appropriate data mask-related operations based on the current mode of operation. For example, in a first mode of operation these components may use a conventional data mask signal. Conversely, in some embodiments the coded value replacement operations illustrated in FIGS. 7 and 8 are performed when a memory system is configured to provide the second mode of operation described above. To this end, the memory controller and the memory module may each include a respective mode controller 902 or 922 (FIG. 9) that determines the current configuration, selects an appropriate mode of operation based on the configuration, and sends a signal to an associated data mask controller 904 or 924 to invoke the coded value replacement operations, as necessary.

In general, a mode controller may comprise any suitable component that may be used to determine and/or define a mode. A mode controller may thus be implemented in a variety of ways. For example, in some embodiments a mode controller may comprise one or more bits of a register or some other form of memory. In these cases, a given mode may be defined by setting or clearing the appropriate mode bit or mode bits. Such a mode bit may be set/cleared when the memory system is configured or initialized, or at some other time. The setting/clearing of a mode bit may be performed automatically by the memory system (e.g., upon detection of the insertion or removal of a memory module), by software, by a user, or in some other suitable manner. For example, when the memory system is initialized, the memory controller may determine an operational mode (e.g., by sensing the number of installed memory modules) and program mode bits of the memory controller and/or a memory module (e.g., mode bits of a register in a memory buffer or a memory device) to enable the desired mode of operation.

The operation of the mode controller and/or some other component of the memory system may thus be affected by the current setting of the register mode bits. For example, a mode bit may be read by another component (e.g., the data mask controller 904 or 924) that takes a particular action based on the mode, or the current value of a mode bit may result in the generation of a signal that is coupled to such a component. In the example of FIG. 9, a mode bit set to a "1" may indicate that a data mask signal-based masking scheme should be used, while a mode bit set to a "0" may indicate that a coded write value-based masking scheme should be used.

As represented by block 804 of FIG. 8A, the memory controller may receive a set of data (e.g., the write data block 702 of FIG. 7) and an associated mask word 704 whenever a system processor or some other component invokes a masked-write to system memory (e.g., comprising one or more memory modules). Here, each entry (e.g., M0, M1, etc.) in the mask word 704 indicates whether a corresponding portion (e.g., WD0, WD1, etc.) of the set of data 702 is to be written to system memory.

As represented by block 806, a coded value selector 906 of the memory controller generates a coded value 706 that is different than any of the write values of the set of data 702 that are to be written to system memory. Through the use of a unique coded value here, the memory module may readily determine whether the data it receives should or should not be written to system memory.

As represented by block 808, a coded value inserter component 908 of the memory controller substitutes the coded value 706 for each portion of the set of data 702 that is not be written to system memory. Referring again to FIG. 7, the coded value inserter 908 may thereby generate a coded data block 708 where each portion of the coded data block that corresponds to a mask value of "1" contains a coded value rather than the original data value from the set of data 702.

As represented by block 810, the memory controller then transmits the coded data block and the coded value to the memory module via a suitable scheme. In some embodiments the memory controller sends the coded data block via a data bus and sends the coded value via a masked-write request (e.g., using spare bits in a column write command) sent over an address bus. In some embodiments the masked-write request comprises the write address, a write command, and the coded value 706. Accordingly, the memory controller may include an address and control module 910 or some other suitable component for generating the appropriate signals to send this information.

As represented by block 814 of FIG. 8B, the memory module of FIG. 9 (e.g., the data mask controller 924) receives the coded data block along with the masked-write request. A command and address module 934 or some other suitable component then processes the masked-write request to obtain the coded value 926.

As represented by block 816, a data analyzer component 928 determines whether any of the portions of the received coded data block include the coded value. Based on the results of this data analysis, a data write controller 930 abstains from writing any of the coded value portions to a memory array 932 but does write the write data values from the non-coded portions of the received coded data block to the memory array 932 according to the specified addresses (block 818). In other words, if contiguous addresses within the memory array 932 are specified for the coded data block, those addresses associated with the "masked" portions of the coded data block will be skipped during the write operations.

The components of FIG. 9B may be implemented in various ways. For example, in some embodiments these components are implemented in one or more memory devices (e.g., separate integrated circuit devices) on a memory module. In some implementations, a first portion of the functionality of these components may be implemented in one or more memory buffers (e.g., separate integrated circuit devices) while a second portion of the functionality of these components (e.g., in addition to memory array 932) is implemented in one or more memory devices.

Referring now to FIGS. 10-13, in another type of data mask scheme a memory controller disables one or more transitions of a data strobe signal to prevent data from being written to a memory module. FIG. 10A illustrates an example of a memory module 1002 where writes are controlled by data mask signals in a first mode of operation. FIG. 10B illustrates an example of timing associated with a write operation that employs a data mask signal. FIG. 11A illustrates a pair of memory modules 1102 and 1104 where, in a second mode of operation, transitions of a data strobe signal are disabled to prevent writes to the memory modules 1102 and 1104. FIG. 11B illustrates an example of timing associated with a write operation where selected transitions of a data strobe signal for the memory module 1104 are disabled. FIGS. 12A and 12B illustrate representative operations that may be performed by a memory controller and a memory module, respectively, for this scheme. FIGS. 13A and 13B illustrate several representative functional components of a memory controller and a memory module, respectively, for this scheme.

Referring initially to FIG. 10A, the memory module 1002 includes eight memory devices Mab, Mcd, . . . , Mop, where two 4-bit portions of a data bus (e.g., DQa and DQb) are routed to each memory device. In some aspects this configuration may relate to a first mode of operation as discussed herein. Here, data is written to and read from each memory device based on a differential data strobe signal DQS/DQS#, a data mask signal DM, and a 24-bit address bus associated with CA0. In general, data is latched for reads and writes at each transition of the data strobe signal. However, selected portions of the data may be prevented from being written to a memory device by setting a corresponding bit of the data mask signal. For convenience, the differential data strobe signal DQS/DQS# and the data mask signal DM are designated in the same way for each memory device. It should be appreciated, however, that a unique set of each of these signals may be associated with each unique memory device.

Figure 10B:
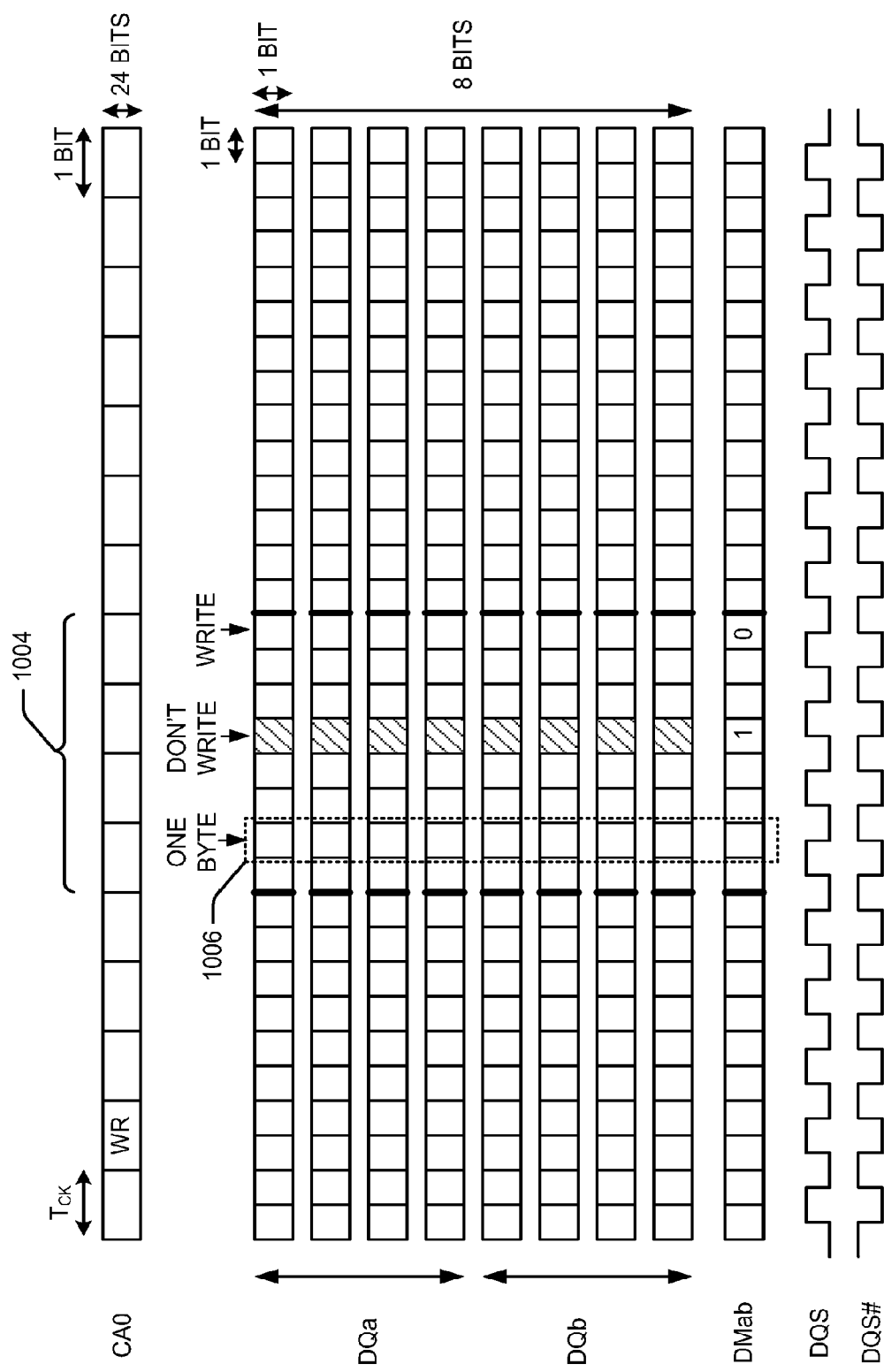

FIG. 10B illustrates various timing relationships for a burst write operation to the memory device Mab. Here, a write command ("WR") on the address bus (associated with CA0) initiates the write operation. The set of data to be written during the burst is indicated by the bracket 1004. The dashed box 1006 illustrates that one byte of data will be written with each transition of the differential data strobe signal DQS/DQS#. In other words, the differential data strobe serves as a timing reference for the subset of the data bus corresponding to DQa and DQb. As represented by the shaded portion of the timing diagram, any portion of the write burst (e.g., a byte of data in this example) that is associated with particular data mask value (e.g., DM for device Mab is set to "1" or some other designated value) will not be written to the memory device Mab.

Referring now to FIG. 11A, the memory system has been reconfigured to include two memory modules 1102 and 1104. In this case, one 4-bit portion of the data bus (DQa) is routed to a memory device Ma0 in the memory module 1104 and one 4-bit portion of the data bus (DQb) is routed to a memory device Mb1 in the memory module 1102.

In some aspects this configuration may relate to a second mode of operation as discussed herein. For example, in a first mode of operation the memory module 1102 is replaced with a continuity module. In this case, an interconnect ("I/C") bus (represented by the dashed lines) between the memory modules 1102 and 1104 will couple the DQb bus to the Ma0 memory device in a similar manner as discussed herein. In contrast, in the second mode of operation where the continuity module is replaced with the memory module 1102, the DQb bus is only coupled to the memory device Mb1.

In the second mode of operation, data is written to and read from the memory devices of each memory module based on transitions of one of the components of the corresponding differential data strobe signal DQS/DQS#. In other words, a single component (e.g., DQS) of the differential data strobe serves as a timing reference for the portion of the data bus designated DQa and the other component (e.g., an inverted DQS#) serves as a timing reference for the portion of the data bus designated DQb. Hence, the data strobe signal for DQb is simply designated as DQS.

Figure 11B:
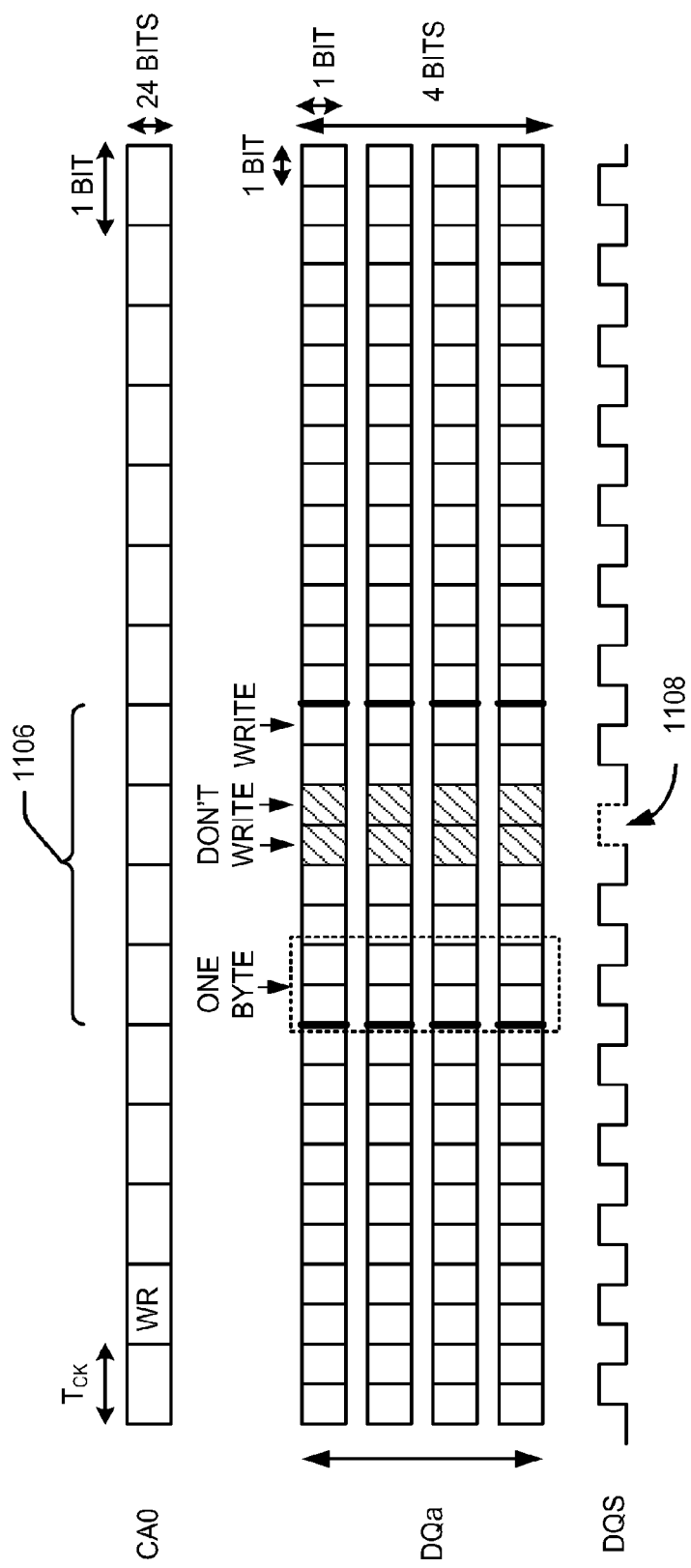

In the example of FIG. 11A, the data mask signal DM is not used by the memory modules 1102 and 1104 in the second mode of operation. Instead, as illustrated by the shaded portion in FIG. 11B, a portion (e.g., a byte) of a write burst (indicated by the bracket 1106) is prevented from being written to a memory device (device Ma0 in this example) by disabling the two transitions 1108 of the data strobe signal DQS that correspond to that portion of the write burst. These operations will be discussed in more detail in conjunction with FIGS. 12 and 13.

Figure 12A:
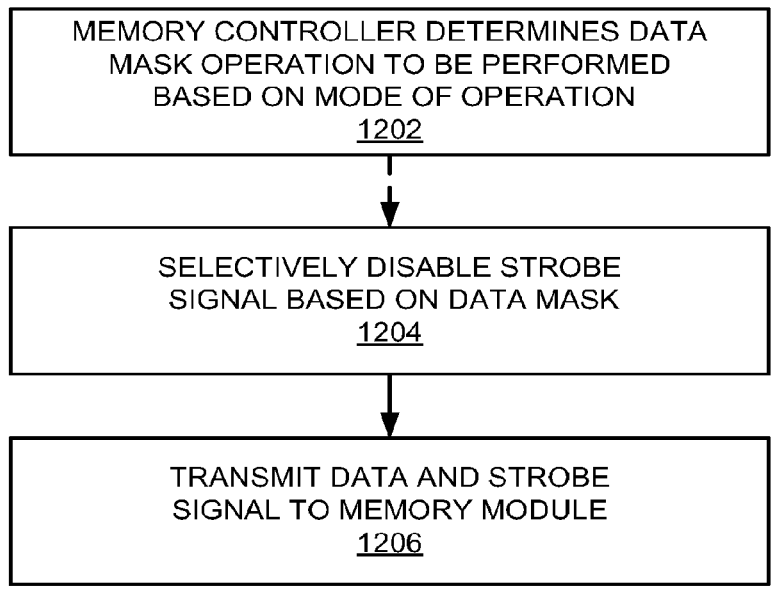
FIGS. 12A and 12B, are flowcharts illustrating an embodiment of operations that may be performed in conjunction with a data mask scheme where transitions of a data strobe signal are disabled.
Figure 12B:
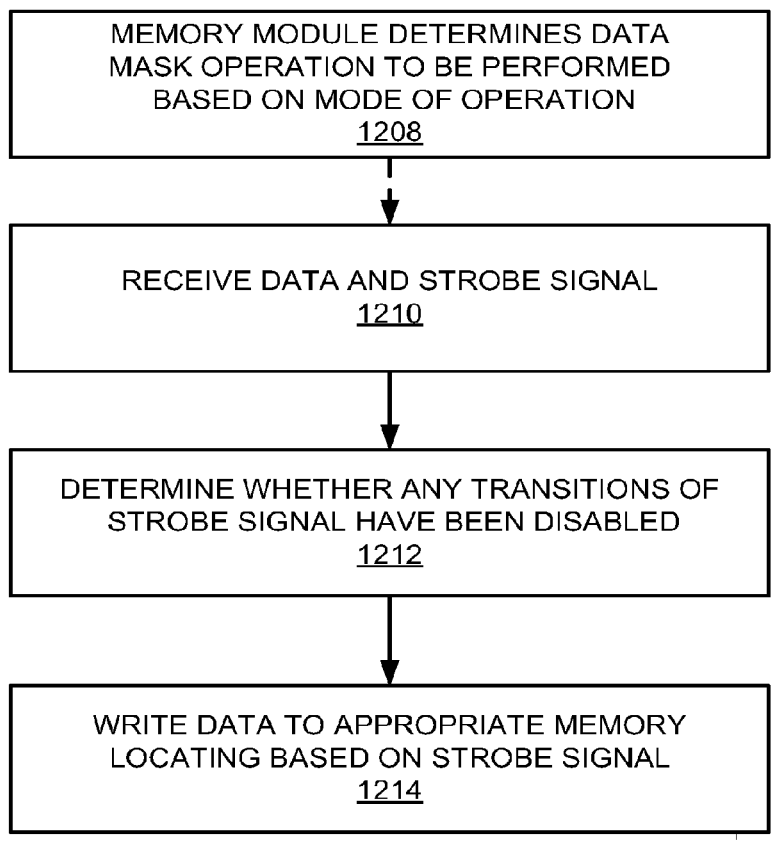

As represented by block 1202 of FIG. 12A and block 1208 of FIG. 12B, the memory controller and the memory module may be configured to perform the appropriate data mask-related operations based on the current mode of operation. For example, in a first mode of operation these components may use a conventional data mask signal. Conversely, in some embodiments the data strobe disabling operations described in FIGS. 11 and 12 are performed when a memory system is configured to provide the second mode of operation described above.

To support the above functionality, the memory controller and the memory module may each include a respective mode controller 1302 or 1322 (FIG. 13) that determines the current configuration, selects an appropriate mode of operation based on the configuration, and sends a signal to an associated data mask controller 1304 or 1324 to invoke the data strobe inhibiting-based operations, as necessary. For example, in a similar manner as discussed above the mode controller and/or some other component of the memory system may be affected by the current setting of register mode bits. In this case, a mode bit may be read by, or an associated signal may be provided to, the data mask controller 1304 or 1324 whereby the data mask controller takes a particular action based on the mode. For example, a mode bit set to a "1" may indicate that a data mask signal-based masking scheme is to be used, while a mode bit set to a "0" may indicate that a strobe disabling-based masking scheme is to be used.

Based on the particular mode of operation the memory controller may provide data at different widths to each memory module, thereby controlling the amount of data that is written in conjunction with a given transition of a data strobe signal or that is not written based on a disabled transition of a data strobe signal. In other words, a byte of data, more than a byte of data, or less than a byte of data may be associated with a given transition of a data strobe signal. Accordingly, through appropriate configuration of the memory system, write control may be provided for sub-portions of any write data word that is provided to the memory controller in a write burst.

As represented by block 1204 of FIG. 12A, the data mask controller 1304 may determine whether to disable (e.g., mask off or not generate) a given transition of the data strobe signal based on a data mask that is received with the data to be written to system memory. Here, it should be appreciated that one transition or more than one consecutive transition of a data strobe signal may be disabled in conjunction with a given entry of the data mask. In the example of FIG. 11B, the memory controller disables consecutive transitions (e.g., a low-to-high transition and the subsequent high-to-low transition) to maintain the relative phase of the data strobe signal.

Depending on the decisions generated by the data mask controller 1304, a data strobe generator 1306 generates a data strobe signal with the appropriate transitions. The memory controller then transmits the set of data and the data strobe signal to the memory module (block 1206) as shown in FIG. 11B. In addition, the memory controller (e.g., a clock generator component 1308) also may provide an associated clock signal to the memory module.

Referring again to FIG. 12B, as the memory module receives the set of data and associated data strobe signal (block 1210), the data mask controller 1324 processes the received data strobe signal to determine whether any transitions have been disabled (block 1212). For example, in some embodiments the data mask controller 1324 may use a received clock signal to sample the received data strobe signal to determine whether there are any "missing" transitions.

As represented by block 1214, based on the results of this analysis of the data strobe signal, a data write controller 1326 determines where the received data is to be written to a memory array 1328. Here, the data write controller 1326 may determine the appropriate address to write a given portion of a received write burst based on a determination of whether any addresses need to be skipped due to a disabled transition of the data strobe signal.

In some implementations the data write controller 1326 may comprise an address counter 1330 that generates a set of addresses for a write burst. For example, for a burst length of eight, the address counter 1330 may generate eight consecutive addresses in conjunction with the eight transitions of the data strobe signal for the write burst. In the event the data mask controller 1324 determines that a given transition of the data strobe signal has been disabled, the data mask controller 1324 may cause the data write controller 1326 to increment the address counter 1330. In this way, at the next transition of the data strobe signal, the associated data will be written to the correct address.

Figure 13A:
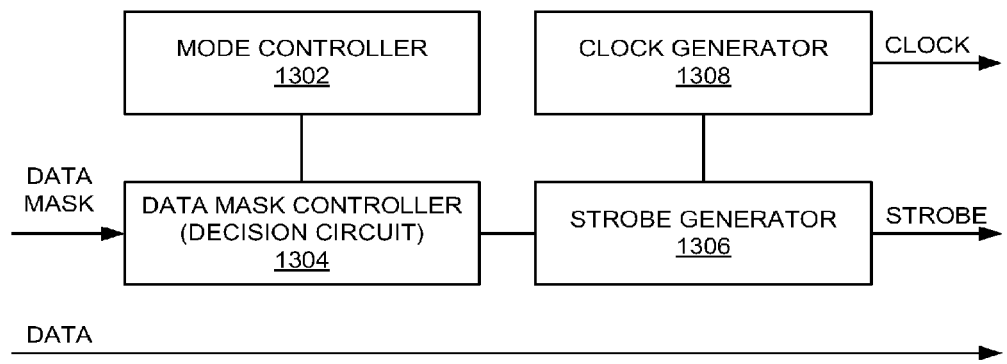
FIGS. 13A and 13B, are simplified block diagrams illustrating sample functional components for implementing a data mask scheme where transitions of a data strobe signal are disabled.
Figure 13B:
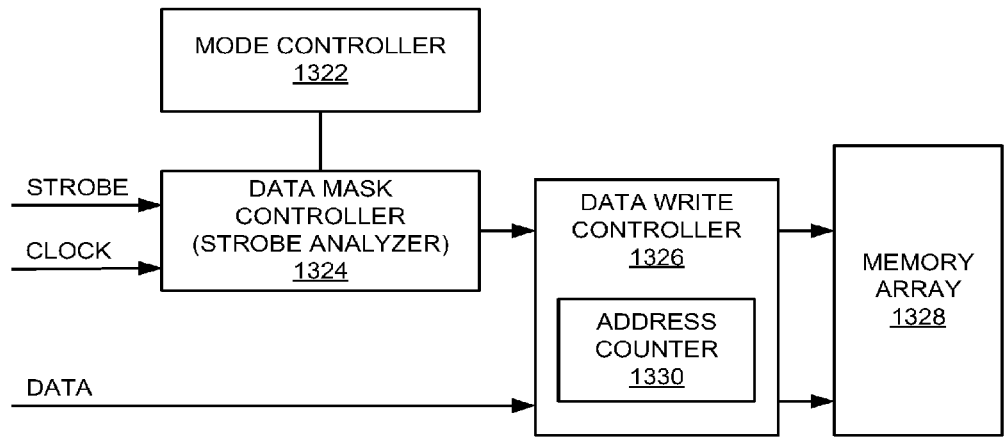

The components of FIG. 13B may be implemented in various ways. For example, in some embodiments these components are implemented in one or more memory devices (e.g., separate integrated circuit devices) on a memory module. In some implementations, a first portion of the functionality of these components may be implemented in one or more memory buffers (e.g., separate integrated circuit devices) while a second portion of the functionality of these components (e.g., in addition to memory array 1328) is implemented in one or more memory devices. A specific example follows.

In an implementation where a memory module includes one or more memory buffers, at least a portion of the functionality of a mode controller 922 (FIG. 9B) and/or 1322 (FIG. 13B), the data mask controller 924 and/or 1324, and the data write controller 930 and/or 1326 may be implemented in each memory buffer. In this case, the memory array 932/1328 and at least a portion of the functionality of the data write controller 930 and/or 1326 may be implemented in each memory device on the memory module. For example, the memory buffer may include protocol translation and data path management functionality that facilitates communicating via one interface with a memory controller and via another interface with one or more memory devices. Thus, at the memory controller interface, the memory buffer may support dynamic point-to-point connectivity, a bi-modal strobe, and multiple data mask schemes as taught herein. Conversely, at the memory device interface, the memory buffer may support the read/write protocol of the memory device (e.g., conventional data bus, data strobe, and data mask signals). To this end, the memory buffer may include appropriate functionality to split the data bus and associated signals (e.g., data strobes), and to selectively write data to a memory device based on the current data mask scheme.

Figure 14:
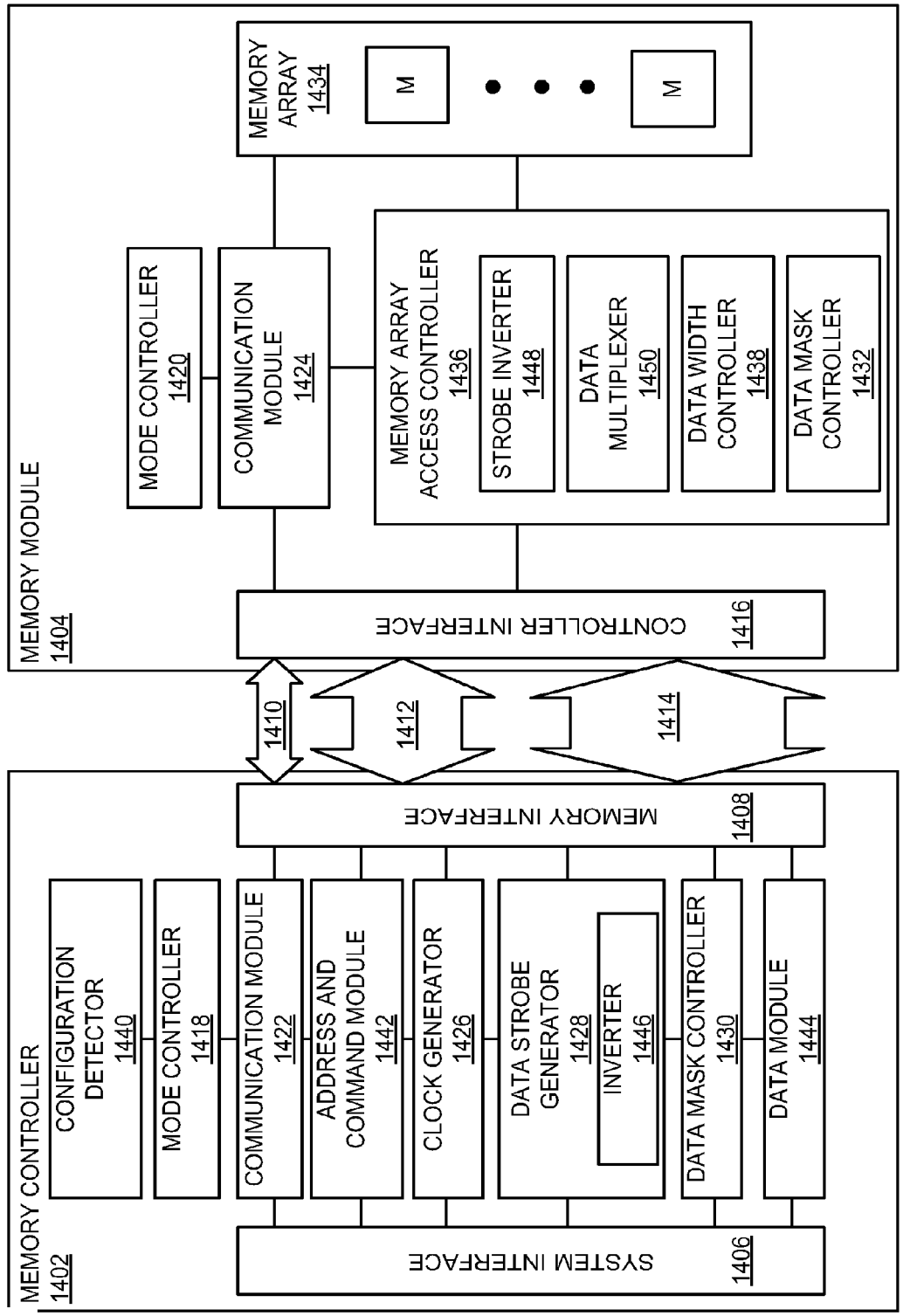
FIG. 14 is a simplified diagram illustrating several components of an embodiment of a memory system.
Figure 15:
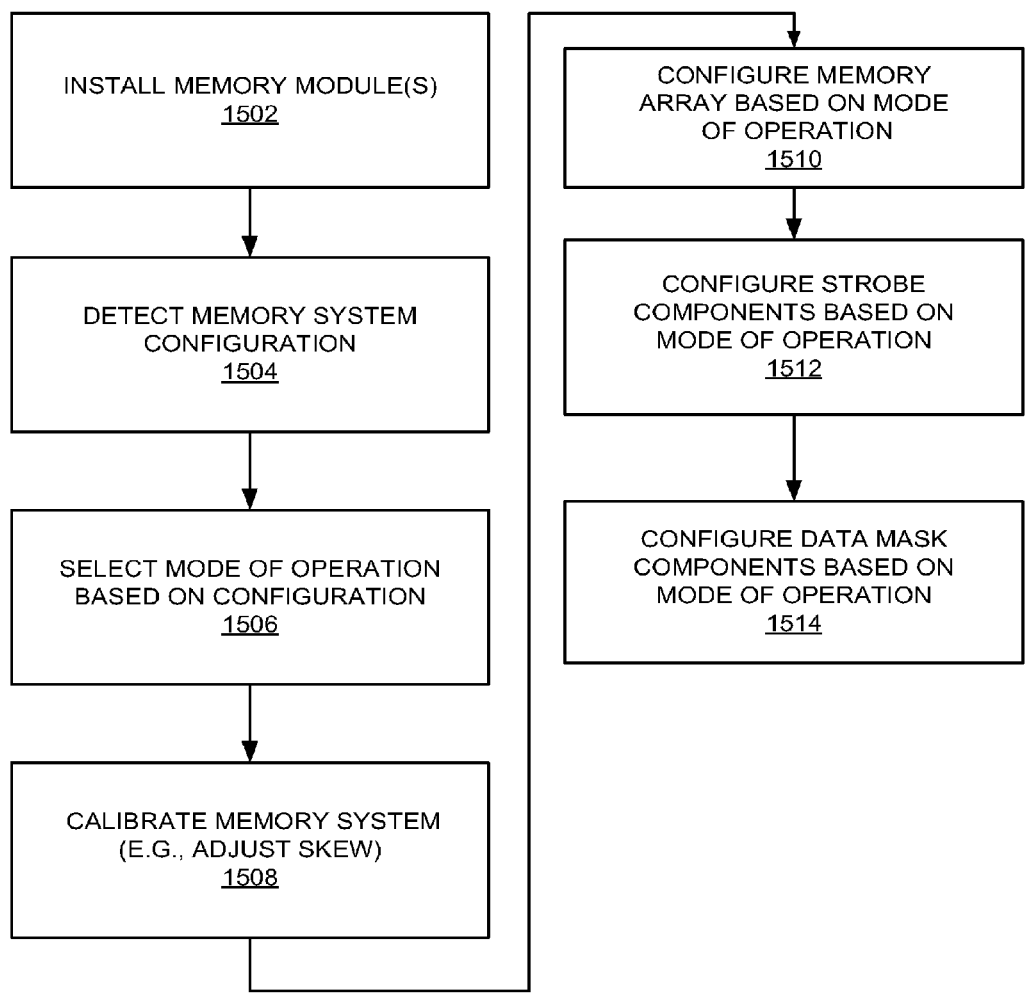
FIG. 15 is a flowchart relating to operations that may be performed by various components of an embodiment of a memory system.
Figure 16:
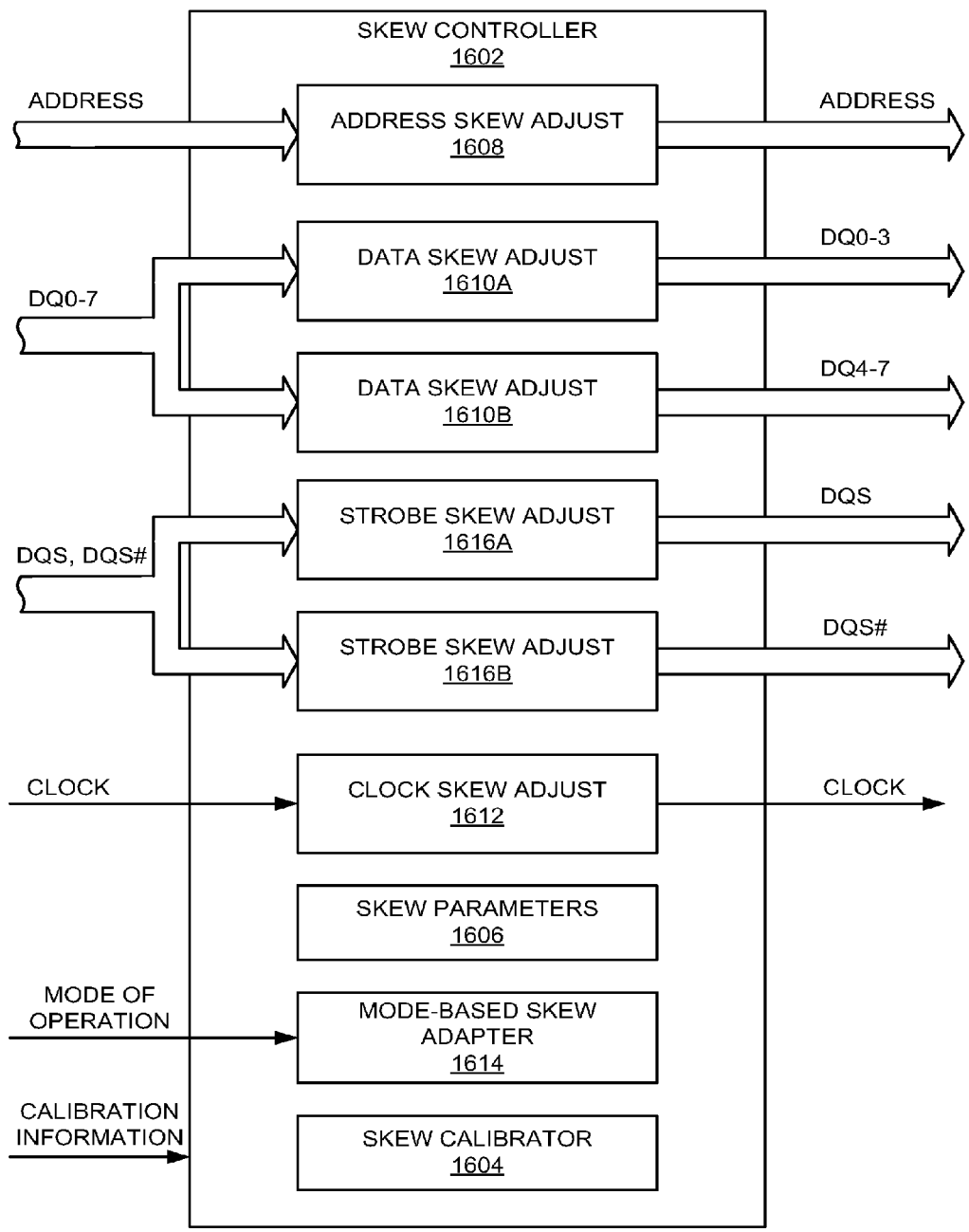
FIG. 16 is a simplified block diagram of an embodiment of a skew controller.
Figure 17:
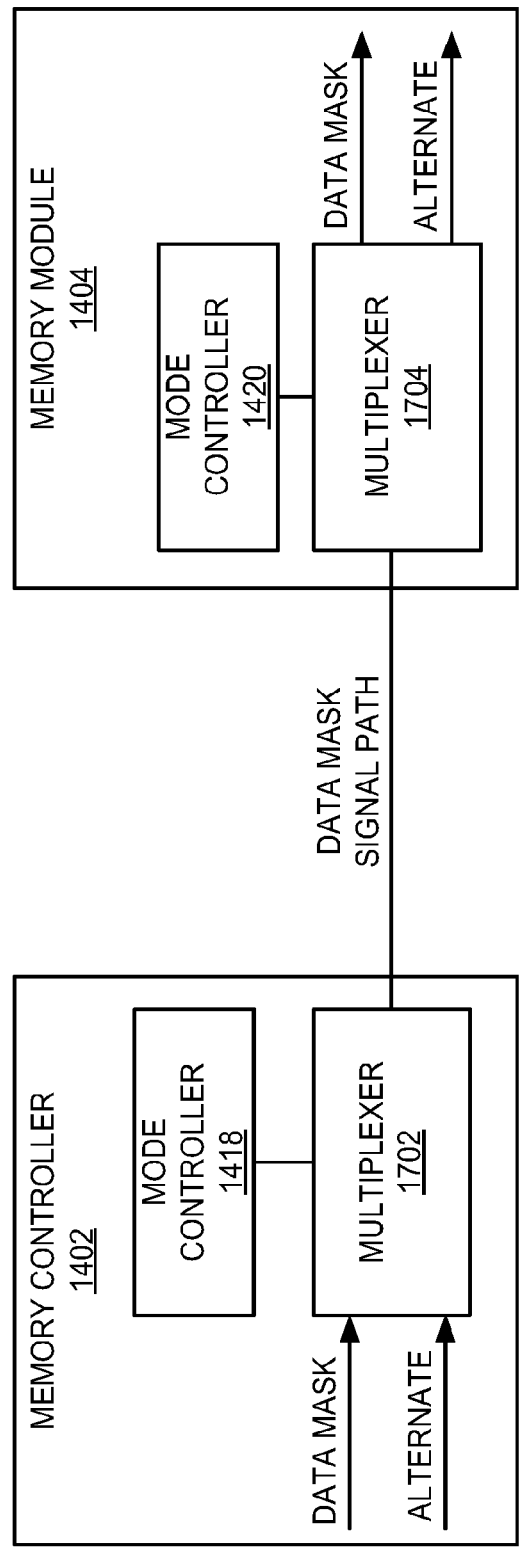
FIG. 17 is a simplified block diagram of components of an embodiment of a memory system where an alternate signal is sent over a data mask signal path.
Figure 18:
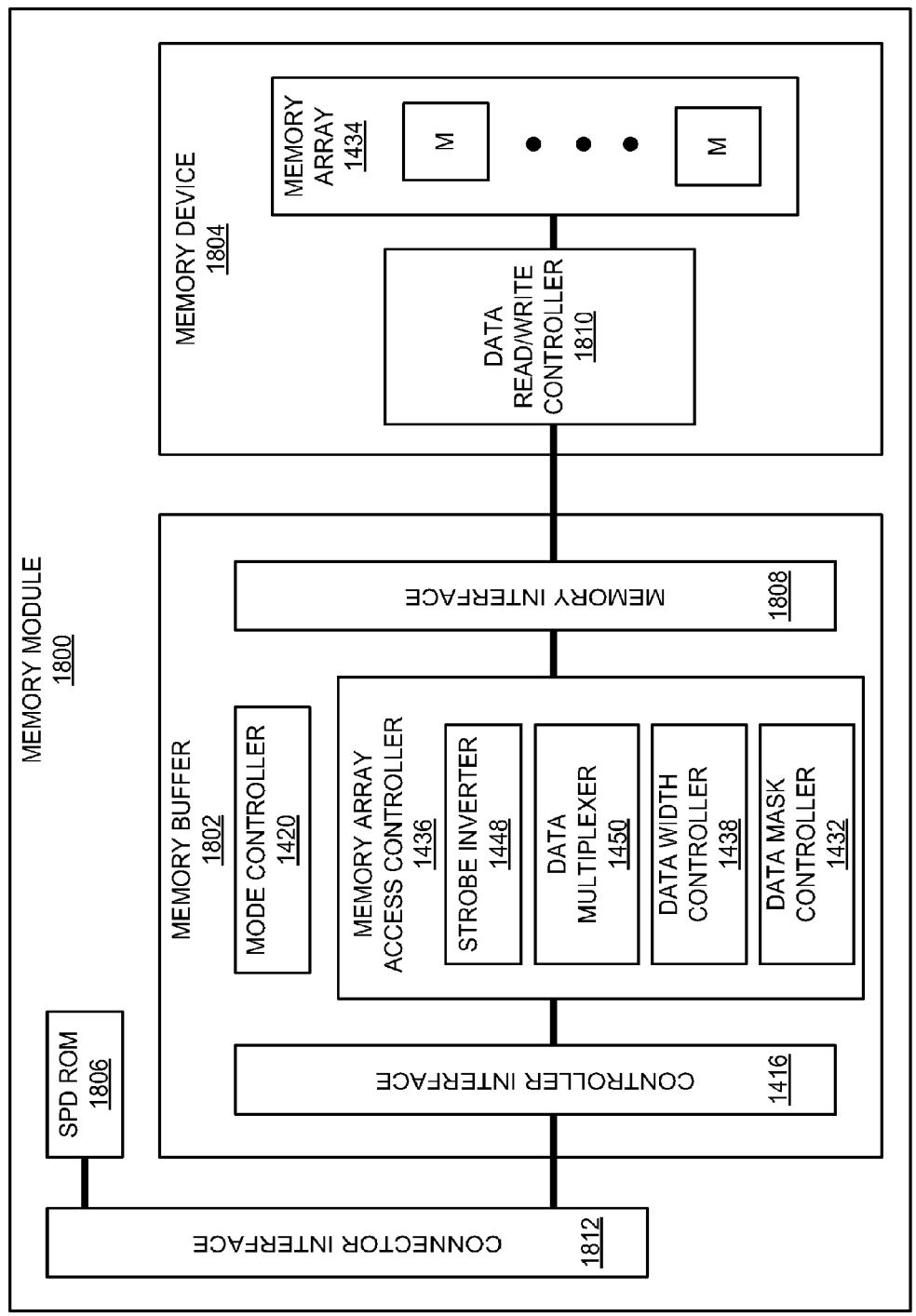
FIG. 18 is a simplified diagram illustrating several components of an embodiment of a memory module.

With the above description in mind, several examples of additional implementation and operational details that may be employed in a memory system will be discussed in conjunction with FIGS. 14-18. FIG. 14 illustrates several functional components of sample embodiments of a memory controller 1402 and a memory module 1404. FIG. 15 illustrates several sample operations that may be performed by the memory controller 1402 and the memory module 1404. FIG. 16 illustrates several functional components of a sample embodiment of a skew controller. FIG. 17 illustrates a sample embodiment for reusing a signal path designated for a data mask. FIG. 18 illustrates an example of a buffered memory module.

The memory controller 1402 of FIG. 14 includes a system interface 1406 for communicating with one or more other system components that access the memory system. In some embodiments the system interface 1406 is adapted to receive address signals, commands, and data mask information, and is adapted to transmit and receive data bus signals, clock signals, and other signals.

The memory controller 1402 also includes a memory interface 1408 for communicating with the memory module 1404. In some embodiments the memory interface 1408 is adapted to transmit address and command signals via an address bus 1412 and is adapted to transmit and receive data-related signals via a data bus 1414 and communication signals via a communication bus 1410. To this end, the memory interface 1408 may comprise suitable signal ports that are adapted to couple to the signal paths of these busses.

Similarly, the memory module 1404 may include a controller interface 1416 that is adapted to interface with the buses 1410, 1412, and 1414. For example, in some embodiments the controller interface 1416 receives address and command signals and provides them to a memory array access controller 1436. In addition, the controller interface 1416 may send and receive data and communication signals in cooperation with the memory array access controller 1436.

The memory controller 1402 includes various components for processing signals it receives via the system interface 1406 or from the memory module 1404. For example, the memory controller 1402 may comprise an address and command module 1442 for interpreting commands from another system component and taking appropriate action (e.g., invoking reads or writes) in response to the commands. In addition, the memory controller 1402 may comprise a data module 1444 that may, for example, store and forward data that is being written to or read from the memory module 1404.

Several of the functional components of the memory controller 1402 and the memory module 1404 may provide functionality that is similar to the functionality described above for similarly named components. For example, the mode controllers 1418 and 1420, the clock generator 1426, the data strobe generator 1428, the data mask controllers 1430 and 1432, and the memory array 1434 may perform operations similar to those described above in conjunction with FIGS. 9 and 13. In a similar manner, the memory array access controller 1436 may provide functionality similar to the data write controllers describe herein as well as other functionality that facilitates accessing the memory array 1434.

The components of the memory module 1404 shown in FIG. 14 may be implemented in various ways. For example, in some embodiments a portion or all of the illustrated components may be implemented in one or more memory devices (e.g., DRAMs) on the memory module 1404 that form the memory array 1434.

As discussed below at FIG. 18, in some embodiments at least a portion of each of the components 1416, 1420, 1424, and 1436 may be incorporated into one or more memory buffer devices on the memory module 1404. In such cases, these components may access one or more memory devices on the memory module 1404 that form the memory array 1434.

The memory array 1434 also may be implemented in various ways. For example, in some embodiments the memory array 1434 comprises an internal memory array (e.g., banks on one or more DRAMs). In some embodiments the memory array 1434 comprises several memory devices (e.g., DRAMs or flash devices) that are accessed via the memory buffer(s).

Referring to FIG. 15, additional functionality relating to the configuration and operation of the components of FIG. 14 based on the current configuration of the memory system will be discussed. As represented by block 1502, at some point in time the memory system is configured by installing one or more memory modules. As discussed above, the memory system may be configured one time or multiple times (i.e., reconfigured). In general, the operations of FIG. 15 apply to either an initial configuration of the memory system or a reconfiguration of the memory system.

As represented by block 1504, a configuration detector component 1440 of the memory controller 1402 detects the current configuration of the memory system at some point in time. In a typical case, this is done whenever the memory controller 1402 is initialized (e.g., after being powered on or reset). A variety of mechanisms may be employed to determine the current configuration of the memory system. For example, in some implementations inserting a memory module into a connector changes the state of a register or signal path (e.g., a trace on the system printed circuit board) that is readable by the memory controller 1402.

In some implementations the memory controller 1402 may communicate with each memory module that is installed in the memory system to determine the presence and capabilities of each memory module. For example, the memory controller 1402 and the memory module 1404 may communicate via a serial bus or some other suitable communication mechanism. To this end, the memory controller 1402 and the memory module 1404 may each include a communication module 1422 or 1424, respectively, each of which is configured to communicate via an appropriate communication channel (e.g., the communication bus 1410).

In some implementations the communication module 1424 may comprise a non-volatile memory device that is used to indicate the various configurations that the memory module 1404 is capable of supporting. Thus, the memory device 1424 may indicate that the memory module 1404 is capable of providing or otherwise supporting dynamic point-to-point connectivity, a bi-modal data strobe (e.g., selecting between a differential strobe and a split strobe), and different data masking techniques (e.g., selecting between first and second data mask schemes) as taught herein. In various embodiments the memory device 1424 may be implemented as a separate integrated circuit, or combined with another component (e.g., a memory buffer or a memory device) of the memory module. In some implementations the memory device 1424 may comprise a serial presence detect ("SPD") ROM. In such cases, the communication module 1422 may be configured to communicate with the SPD ROM via an appropriate data bus.

At block 1506 the memory controller 1402 and/or a memory module selects a mode of operation based on the current configuration of the memory system. For example, one or both of these devices may set an appropriate bit in a control register that thereby effects the operation of certain components of each device. As described above the mode controller 1418 may define a first mode of operation if a single memory module and a continuity module are installed in the memory system. Conversely, the mode controller 1418 may define a second mode of operation if two memory modules are installed in the memory system.

At block 1508 the memory controller 1402 may perform a calibration procedure to compensate for different signal propagation delay times associated with different address, data, and clock signal paths between the memory controller 1402 and any installed memory modules. To this end, the memory interface 1408 or some other suitable component may comprise a skew controller that is adapted to adjust a delay imparted on individual signals or sets of signals transmitted or received by the memory controller 1402.

In some implementations each memory module may adjust the skew of signals received or transmitted via the data bus 1414 or some other bus. In this case, the memory module 1404 (e.g., the controller interface 1416) may incorporate skew controller functionality.

In a typical implementation, a skew controller is configured to substantially time align each set of data bus signals with an associated data strobe signal (e.g., a differential strobe or a single ended strobe). In this way, the memory system may compensate for timing skew that may otherwise result between these signals as a result of different signal path lengths provided for the data bus signals and the data strobe signal.

FIG. 16 illustrates a sample embodiment of a skew controller 1602 that may be incorporated into one or more of the components described herein. The skew controller 1602 may include a skew calibrator 1604 that obtains and/or maintains information used during the calibration operation regarding the signal propagation delay times associated with various signal paths. This information may include, for example, the lengths of bus traces between the memory controller 1402 and each of the connectors for the memory modules. Based on this information and any other suitable information the skew calibrator 1604 may generate skew parameters (e.g., delay time values) 1606 that are used by various skew adjust components 1608, 1610A, 1610B, 1612, 1616A and 1616B to adjust timing of signals associated with the address bus, the data bus, the data strobe bus, a clock, or some other bus. For example, a clock signal or a data signal may be delayed to ensure that transitions of the data signal are time aligned (or related in time in some other manner) with transitions of the clock signal at a given component (e.g., the memory controller 1402 or the memory module 1404). To determine the appropriate delay time values, the skew calibrator 1604 may, for example, take into consideration corresponding trace lengths, signal path characteristics, signal loading characteristics of installed components, delays associated with signals passing through a continuity module, and other suitable factors.

In some implementations such an adjustment may be made independently for each memory module and for each subset of the data bus (e.g. for each memory device Mab, Mcd, etc., depicted in FIG. 11A). As discussed above, each subset of the data bus may comprise a portion of the data signals and associated data strobe and mask signals. Accordingly, to ensure optimum memory performance for each memory device, it may be desirable to adapt the skew of the signals associated with that device independently of any adaptation of the skew of signals associated with other devices.

The memory controller 1402 and/or the memory module 1404 may further adapt the skew associated with one or more signals based on the selected mode of operation. For example, in the second mode of operation the skew of the individual portions of the data bus that are split to go to the different memory modules may be independently controlled.

Referring to the example of FIG. 16, the illustrated data bus segment comprises DQ0-7. In the first mode of operation this bus segment may be routed to one memory module (e.g., to memory devices Ma0 and Mc0 in FIG. 11A) whereby a portion of the bus segment may be routed through a continuity module. When this bus segment is split for the second mode of operation a first portion of the bus segment including the DQ0-3 is routed to one memory module (e.g., to memory device Ma0 in FIG. 11A) and a second portion of the bus segment including the DQ4-7 is routed to another memory module (e.g., to memory device Mb1 in FIG. 11A). Thus, it should be appreciated that some of the signal paths for the bus segment may have different path lengths in the different modes of operation. To compensate for signal skew that may result from these different path lengths, separate skew adjust components 1610A and 1610B may independently adjust the skews for the first and second portions, respectively, of the bus segment.

The illustrated data strobe bus comprises a differential data strobe signal DQS/DQS#. In the first mode of operation the differential strobe may be routed to one memory module (e.g., to memory devices Ma0 and Mc0 in FIG. 11A) whereby one of the data strobe signal components (e.g., DQS #) may be routed through a continuity module. When the data strobe bus is split for the second mode of operation, the DQS signal may be routed to one memory module (e.g., to memory device Ma0 in FIG. 11A) and the DQS# signal may be routed to another memory module (e.g., to memory device Mb1 in FIG. 11A).

In a similar manner as discussed above, one of the differential data strobe signal components may have a different path length in the different modes of operation. Thus, provisions may be taken to ensure that each data strobe signal component is properly skewed in each mode of operation. In the first mode of operation skewing may be employed to ensure that the different components of the differential data strobe are substantially complementary (e.g., 180° out of phase). In the second mode of operation skewing may be employed to ensure that each data strobe signal component is properly aligned with an associated portion of the data bus. Thus, as shown in FIG. 16 separate skew adjust components 1616A and 1616B may be provide for independently adjusting the skews for DQS and DQS#, respectively.

In view of the above it should be appreciated that different skew parameters 1606 may be used for different modes of operation. To this end, the skew controller 1602 may include a mode-based skew adapter 1614 that is configured to adapt the skew parameters 1606 based on the current mode of operation.

The components of FIG. 16 may be implemented in various ways. For example, these components may be implemented at least in part in one of more of a memory controller (e.g., in bus interface 1408), one or more memory buffers, or one or more memory devices.

Referring again to FIG. 15, at block 1510 each installed memory module may be configured based on the selected mode of operation. For example, a data width controller 1438 may define different widths for a data path of the memory array 1434 for different modes of operation. As a specific example, in the first mode of operation the data width controller 1438 may configure a data multiplexer 1450 to couple all of the bits of the data bus 1414 to a data path for the memory array 1434. In this way, all of the data from the data bus 1414 is stored on the memory module 1404 in the first mode of operation.

Conversely, in the second mode of operation the data width controller 1438 may configure the data multiplexer 1450 to couple a portion (e.g., half) of the bits of the data bus 1414 to the data path for the memory array 1434. Thus, in this case, only a portion of the data from the data bus (e.g., bits 0-31) is stored on the memory module 1404. Hence, in the second mode of operation the width of the data path for the memory array 1434 is half of what it was for the first mode of operation. The other memory module (not shown in FIG. 14) may be configured in a similar way to store the data associated with the other half of the data bus (e.g., bits 32-63).

At block 1512 of FIG. 15 the memory controller 1402 and/or the memory module 1404 may configure data strobe-related components based on the current mode of operation. For example, the data strobe generator 1428 may include an inverter component 1446 that inverts one of the components of the differential data strobe in the second mode of operation as discussed above. Alternatively, the memory module 1404 may include an inverter component 1448 to invert the data strobe as discussed above or the memory module 1404 may be configured in some other way to operate with an inverted data strobe in the second mode of operation.

The memory controller 1402 also may include appropriate circuitry to facilitate latching data received from the memory modules in the first and second modes of operation. For example, in the first mode of operation the receive path of the memory controller 1402 is configured so that the differential data strobe signal latches data received via an associated subset of the data bus. In contrast, in the second mode of operation the receive path is configured so that one of the components of the differential data strobe signal is used to latch data received via a first portion of this subset of the data bus, and the other component of the differential data strobe signal is used to latch data received via a second portion of this subset of the data bus.

At block 1514 the memory controller 1402 and/or the memory module 1404 may configure data mask-related components based on the current mode of operation. For example, as discussed above in the first mode of operation the data mask controller 1430 may provide a data mask signal to the memory module 1404 to prevent specified portions of a set of data (e.g., a write burst) from being written to the memory array 1434. Then, in a second mode of operation the data mask controller 1430 may invoke the coded value replacement scheme or the data strobe disabling scheme for writes to one or both of the memory modules. The data mask controller 1432 of the memory module 1404 may then provide complementary functionality to disable writes to the memory array 1434 based on the current data mask scheme.

Referring now to FIG. 17, in some embodiments where the data mask signal is not used during one or more modes of operation the associated data mask signal path (e.g., one or more traces in a printed circuit board, input/output ports of a device, and so on) may be used for some other signal. Accordingly, the memory controller 1402 and the memory module 1404 may each include a multiplexer 1702 or 1704, respectively, that is adapted to couple either the data mask signal or an alternative signal to the data mask signal path. Here, the mode controllers 1418 and 1420 may generate appropriate mode indication signals to control the configuration of the multiplexers 1702 and 1704.

The teachings herein are applicable to a variety of different types of memory system architectures. For example, the above techniques may be implemented in a direct attach memory system or a buffer-based memory system.

As mentioned above, the components of the memory module 1404 may be implemented in one or more memory buffers and/or one or more memory devices. For example, in some embodiments all of the components depicted in FIG. 14 as being associated with the memory module 1404 may be incorporated into one or more memory devices.

FIG. 18 illustrates an embodiment of a memory module 1800 where a portion of the memory module components of FIG. 14 are implemented in a memory buffer device 1802 and another portion of the memory module components of FIG. 14 are implemented in a memory device 1804. In this example the memory device 1804 includes a data read/write controller 1810 that writes data to and reads data from the memory array 1434 based on a particular read/write protocol supported by the memory device 1804. In addition, as mentioned above the memory buffer 1802 also may include read/write functionality as implemented, for example, by the memory array access controller 1436.

The components of the memory module 1800 may be implemented as separate integrated circuit devices. For example, the memory buffer device 1802 may be implemented as one integrated circuit device and the memory device 1804 may be implemented as another integrated circuit device. Thus, the memory buffer 1802 may include a set of interfaces 1416 and 1808 for interfacing with a memory controller and the memory device 1804, respectively. FIG. 18 also illustrates an embodiment where an SPD ROM 1806 is provided as yet another integrated circuit device on the memory module 1800. Here, the interface 1416 and the SPD ROM 1806 are coupled to a connector interface 1812 via signal paths (as represented by the thicker lines). In some embodiments the connector interface 1812 is configured to be inserted into a connector, for example, as described above in conjunction with FIG. 1.

Figure 19:
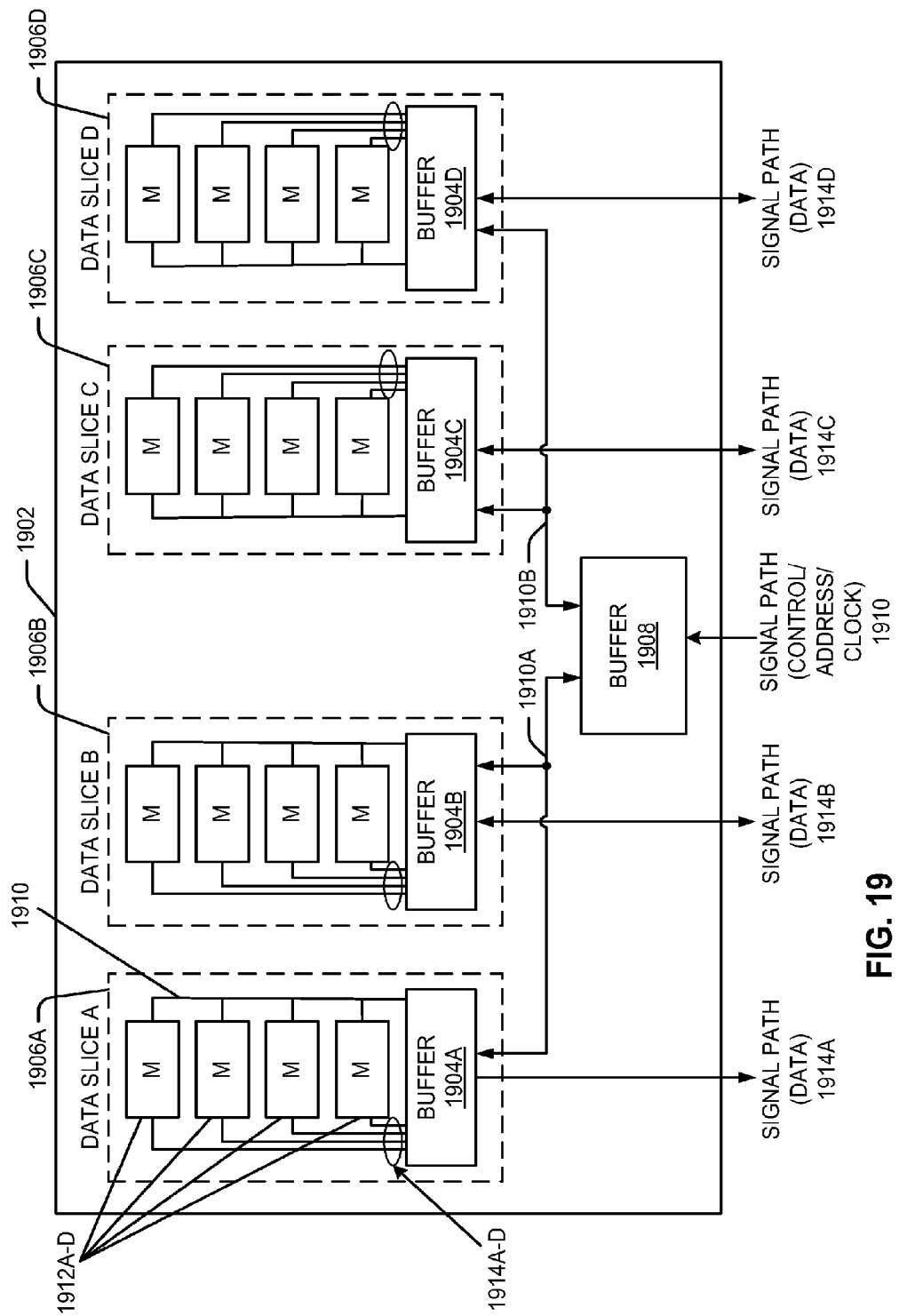
FIG. 19 is a simplified block diagram of an embodiment of a memory module comprising buffers.

FIG. 19 illustrates an embodiment of a memory module 1902 that incorporates a series of memory buffer devices 1904A-1904D, each of which may buffer signals and provide other functionality (e.g., as discussed above in conjunction with memory module 1404) for one or more slices (subsets) 1906A-1906D of a data bus. Here, each data slice 1906A-1906D includes a set of memory devices M (e.g., devices 1912A-1912D) that in some embodiments may be implemented as separate integrated circuit dies (e.g., in separate packages or within a common package).

In some aspects a buffer device is an integrated circuit that acts as an interface between a memory module connector interface and at least one integrated circuit memory device. The buffer devices 1904A-1904D may be configured to perform one or more of isolating, storing, routing, or translating signals for the memory devices M in each of the data slices 1906A-1906D. Such signals may comprise, for example, signal paths 1914A-1914D for a data bus and signal paths 1910 for control, address, and clock signals. Through the use of these buffers, signals of sufficient quality and having desired timing characteristics may be more effectively provided for and received from each of the memory devices M (e.g., devices 1912A-1912D) of each of the data slices 1906A-1906D.

In some embodiments a buffer device 1908 may be used to provide address, control and clock signals for the memory module 1902. The buffer device 1908 may be a clocked buffer device that adjusts a temporal relationship for control and address information provided via signal paths 1910A and 1910B. In some embodiments the buffer device 1908 receives control information that specifies an access to the at least one of the memory devices M, whereby the buffer device 1908 outputs an appropriate control signal to the specified memory device.

In practice, appropriate termination may be associated with each of the signal paths of the memory module 1902. In particular, such terminations may be matched to each corresponding leg of the signal paths.

In the example of FIG. 19, control, address, and clock signals are provided to the memory devices M in a split multi-drop topology and different sets of the data signals are provided separately to each of the memory devices M. It should be appreciated, however, that the buffers 1904A-1904D may be utilized with other bus architectures.

The memory buffers and the memory devices may be implemented in various ways. For example, in some embodiments each of the memory buffers 1904A-1904D and 1908 and each of the memory devices M may be implemented as separate integrated circuit devices. In other embodiments the functionality of the memory buffers 1904A-1904D and 1908 may be combined into a single integrated circuit. Such memory buffers also may include appropriate signal ports and signal interfaces (e.g., signal receivers and signal drivers) for interfacing with one or more memory devices and/or one or more memory module connectors (e.g. that provides connectivity to a memory controller).

In some embodiments the memory buffer(s) and the memory device(s) may be implemented on separate integrated circuit dies. Here, an integrated circuit memory device may be distinguished from the memory die in that a memory die may be a monolithic integrated circuit formed from semiconductor materials for storing and/or retrieving data or other memory functions, whereas an integrated circuit memory device may be a memory die having at least some form of packaging. Similarly, an integrated circuit buffer device may be distinguished from a buffer die in that a buffer die may be a monolithic integrated circuit formed from semiconductor materials that performs at least one memory buffer function as taught herein, wherein an integrated circuit buffer device may be buffer die having at least some form of packaging.

In some aspects, a memory device may comprise a semiconductor integrated circuit device that includes a set of storage cells, which may collectively provide a memory array or a portion of a memory array. Examples of such memory devices include volatile memory devices, nonvolatile memory devices, DRAMs, SRAMs, and flash memory devices.

A memory system as taught herein may be used in a variety of applications. For example, such a memory system may be incorporated into a computer graphics card, a videogame console, a printer, a personal computer, a server, or some other apparatus that utilizes data storage.

It should be appreciated that various modifications may be made to the disclosed embodiments or other embodiments implemented according to the teachings herein. For example, the teachings herein may be applicable to synchronous or asynchronous memory systems and to point-to-point topologies or other topologies. The buses described herein may be implemented using traces of a printed circuit board, using cables, or implemented in some other suitable manner. In addition, some of the teachings herein may be applicable to reconfigurable memory systems that utilize one, two, three or more memory modules. A reconfigurable memory system also may include functionality as disclosed herein yet be implemented using components other than a memory controller or memory modules.

It should be appreciated that a memory system may be reconfigurable even though it may only be used in one configuration. In other words, the term reconfigurable relates to whether a given memory system is capable of being configured in different ways, and does not require that the system is actually used in more than one configuration. In practice, it may often be the case that a memory system is initially configured in one way and is never reconfigured. In such a case, however, the memory system may still perform certain operations relating to the configurability of the memory system. For example, when such a memory system is brought into service (e.g., upon initialization of the memory system), one or more of the components of the memory system may determine the current configuration and, based on the determined configuration, provide certain functionality (e.g., a mode of operation) relating to that particular configuration.

Also, when a given apparatus is configured in a certain manner (e.g., a particular mode of operation is selected), the apparatus may not necessarily perform the associated operations at that time. Rather the apparatus may simply be adapted such that it is capable of performing the operations in question. Hence, an apparatus configured to operate in two different modes of operation may operate in only a first one of the modes, may operate in only a second one of the modes, or may switch between the two modes when it is operated.

The various structures and functions described herein may be implemented in various ways and using a variety of functional components. For example, a function or a functional component (e.g., a controller, a module, and so on) described herein may be implemented using various hardware components such a processor, a controller device, a state machine, logic, discrete components, or some combination of one or more of these components. In some implementations such components may be implemented in one or more integrated circuit devices.

In addition, code including instructions (e.g., software, firmware, middleware, etc.) may be executed on one or more processing devices to implement one or more of the described functions or components. The code and associated components (e.g., data structures and other components used by the code or used to execute the code) may be stored in an appropriate data memory (e.g., commonly referred to as a computer-readable medium) that is readable by a processing device or some other suitable device.

It should be appreciated that the recited orders of the blocks for the processes disclosed herein are simply examples of suitable approaches. Thus, in some aspects operations associated with such blocks may be rearranged while remaining within the scope of the present disclosure. Similarly, the accompanying method claims present operations in a sample order, and are not necessarily limited to the specific order presented.

Also, it should be understood that any reference to elements (e.g., sets of data, data paths, data strobes, portions, and so on) herein using a designation such as "first," "second," and so forth does not generally limit the quantity or order of those elements. Rather, these designations may be used herein as a convenient method of distinguishing between two or more different elements or instances of an element. Thus, a reference to first and second elements does not mean that only two elements may be employed there or that the first element must precede the second element in some manner. Also, unless stated otherwise a set of elements may comprise one or more elements.

The components and functions described herein may be connected or coupled in various ways. The manner in which this is done may depend, in part, on whether and how the components are separated from the other components. In some embodiments some of the connections or couplings represented by the lead lines in the drawings may be in an integrated circuit, on a circuit board or implemented as discrete wires, or in some other way.

The signals discussed herein may take various forms. For example, in some embodiments a signal may comprise electrical signals transmitted over a wire, light pulses transmitted through an optical medium such as an optical fiber or air, or RF waves transmitted through a medium such as air, etc. In addition, a plurality of signals may be collectively referred to as a signal herein. The signals discussed above also may take the form of data. For example, in some embodiments an application program may send a signal to another application program. Such a signal may be stored in a data memory.

While certain sample embodiments have been described above in detail and shown in the accompanying drawings, it is to be understood that such embodiments are merely illustrative of and not restrictive of the teachings herein. In particular, it should be recognized that the teachings herein may apply to a wide variety of apparatuses and methods. It will thus be recognized that various modifications may be made to the illustrated and other embodiments as taught herein, without departing from the broad inventive scope thereof. In view of the above it will be understood that the teachings herein are not limited to the particular embodiments or arrangements disclosed, but are rather intended to cover any changes, adaptations or modifications which are within the scope of the appended claims.

What is claimed is:

1. A memory device, comprising:
   a memory array;
   a mode controller to select a first mode of operation or a second mode of operation; and
   a data width controller coupled to the mode controller and to:
     in the first mode of operation, define a first width of a data path for a first set of data signals received by the memory array, wherein a differential signal comprising a first data strobe signal component and a second data strobe signal component provides a first timing reference for the first set of data signals received via the data path; and
     in the second mode of operation, define a second width of the data path for a second set of data signals received by the memory array, wherein the first width is wider than the second width, and wherein the first data strobe signal component of the differential signal, but not the second data strobe component of the differential signal, provides a second timing reference for the second set of data signals received via the data path.

2. The memory device of claim 1, wherein the first and second data strobe signal components collectively form a differential signal.

3. The memory device of claim 1, further comprising an inverter to, in the second mode of operation, invert a phase of one of the data strobe signal components.

4. The memory device of claim 1, further comprising a skew controller to adjust timing of the first or second set of data signals received via the data path and at least one of the data strobe signals.

5. The memory device of claim 1, further comprising at least one buffer to buffer signals between the data path and the memory array.

6. The memory device of claim 1, further comprising a data mask controller to determine whether a portion of a write burst received via the data path comprises a coded write data value that indicates that the portion of the write burst is not to be written to the memory array.

7. The memory device of claim 1, further comprising a data mask controller coupled to the data path and to determine whether at least one transition of at least one of the data strobe signals has been disabled to prevent a portion of a write burst from being written to the memory array.

8. A method of storing data, comprising:
   selecting a first mode of operation or a second mode of operation; and
   receiving data via a data path for a memory array, wherein:
     in the first mode of operation a first width of the data path is defined for a first set of the received data, and a first data strobe signal component and a second data strobe signal component are provided as a first timing reference for the first set of the received data; and in the second mode of operation a second width of the data path is defined for a second set of the received data, and the first data strobe signal component, but not the second data strobe component, is provided as a second timing reference for the second set of the received data, wherein the first width is wider than the second width.

9. The method of claim 8, wherein the first and second data strobe signal components collectively form a differential signal.

10. The method of claim 8, further comprising inverting a phase of one of the data strobe signal components in the second mode of operation.

11. The method of claim 8, further comprising adjusting timing of at least one of the data strobe signal components and the first or second set of received data.

12. The method of claim 8, further comprising buffering the received data between the data path and the memory array.

13. The method of claim 8, further comprising determining whether a portion of a write burst of the first or second set of received data comprises a coded write data value that indicates that the portion of the write burst is not to be written to the memory array.

14. The method of claim 8, further comprising determining whether at least one transition of at least one of the data strobe signal components has been disabled to prevent a portion of a write burst of the received data from being written to the memory array.

15. An apparatus for storing data, comprising:
a mode controller to select a first mode of operation or a second mode of operation; and
a memory array access controller to receive data via a data path for a memory array, wherein:
in the first mode of operation a first width of the data path is defined for a first set of the received data, and a first data strobe signal component and a second data strobe signal component are provided as a first timing reference for the first set of the received data; and
in the second mode of operation a second width of the data path is defined for a second set of the received data, and the first data strobe signal component, but not the second data strobe component, is provided as a second timing reference for the second set of the received data, wherein the first width is wider than the second width.

16. The apparatus of claim 15, wherein the first and second data strobe signal components collectively form a differential signal.

17. The apparatus of claim 15, further comprising an inverter to invert a phase of one of the data strobe signal components in the second mode of operation.

18. The apparatus of claim 15, further comprising a skew controller to adjust timing of at least one of the data strobe signal components and the first or second set of received data.

19. The apparatus of claim 15, further comprising a buffer to buffer the received data between the data path and the memory array.

20. The apparatus of claim 15, further comprising a data mask controller to determine whether a portion of a write burst of the first or second set of received data comprises a coded write data value that indicates that the portion of the write burst is not to be written to the memory array.

* * * * *